United States Patent
Iwashima et al.

(10) Patent No.: US 10,279,759 B2
(45) Date of Patent: May 7, 2019

(54) SYSTEM AND METHOD FOR STABILIZING AIRCRAFT ELECTRICAL SYSTEMS

(71) Applicants: Kawasaki Jukogyo Kabushiki Kaisha, Kobe-shi, Hyogo (JP); The Boeing Company, Chicago, IL (US)

(72) Inventors: Atsushi Iwashima, Yamagata (JP); Kazushige Sugimoto, Amagasaki (JP); Kazuya Matsuo, Kobe (JP); Joseph S. Breit, Bellevue, WA (US); Farhad Nozari, Woodinville, WA (US)

(73) Assignees: KAWASAKI JUKOGYO KABUSHIKI KAISHA, Kobe-Shi, Hyogo (JP); THE BOEING COMPANY, Chicago, IL (US)

( * ) Notice: Subject to any disclaimer, the term of this patent is extended or adjusted under 35 U.S.C. 154(b) by 431 days.

(21) Appl. No.: 14/418,074

(22) PCT Filed: Jul. 29, 2013

(86) PCT No.: PCT/US2013/052596
§ 371 (c)(1),
(2) Date: Jan. 28, 2015

(87) PCT Pub. No.: WO2014/062269
PCT Pub. Date: Apr. 24, 2014

(65) Prior Publication Data
US 2015/0165990 A1    Jun. 18, 2015

Related U.S. Application Data

(63) Continuation-in-part of application No. 13/561,670, filed on Jul. 30, 2012, now abandoned.

(51) Int. Cl.
G05B 13/02    (2006.01)
B60R 16/03   (2006.01)
(Continued)

(52) U.S. Cl.
CPC ............ B60R 16/03 (2013.01); B64D 41/007 (2013.01); G05B 13/02 (2013.01); H02J 4/00 (2013.01);
(Continued)

(58) Field of Classification Search
None
See application file for complete search history.

(56) References Cited

U.S. PATENT DOCUMENTS 4,823,247 A    4/1989   Tamoto
5,910,892 A *  6/1999   Lyons .................. H02M 7/487
                                                    363/132

(Continued)

FOREIGN PATENT DOCUMENTS

| EP | 2213571 A2 | 8/2010 |
|---|---|---|
| JP | 2012143018 A | 7/2012 |
| WO | 2012081174 A1 | 6/2012 |

OTHER PUBLICATIONS

European Patent Office, Extended European Search Report Issued in Application No. 13846974.7, dated Mar. 29, 2016, Germany, 6 pages.

(Continued)

*Primary Examiner* — Mohammad Ali
*Assistant Examiner* — Kelvin Booker
(74) *Attorney, Agent, or Firm* — Alleman Hall Creasman & Tuttle LLP

(57) ABSTRACT

An electric system of an aircraft includes a power stabilizing device connected to a primary AC bus and a secondary battery. The secondary battery has a rated voltage which allows the secondary battery to absorb regenerative power from a control surface actuator. Based on a voltage and a (Continued)

frequency in the primary AC bus, charging/discharging of the secondary battery is controlled to stabilize the electric system.

17 Claims, 14 Drawing Sheets

(51) Int. Cl.
- *H02J 4/00* (2006.01)
- *B64D 41/00* (2006.01)
- *G01R 31/42* (2006.01)
- *G01R 31/00* (2006.01)

(52) U.S. Cl.
CPC ............ *G01R 31/008* (2013.01); *G01R 31/42* (2013.01); *Y02T 50/54* (2013.01)

(56) References Cited

U.S. PATENT DOCUMENTS

| | | | |
|---|---|---|---|
| 7,233,506 B1 | 6/2007 | Paice | |
| 7,502,233 B2 | 3/2009 | Kim et al. | |
| 7,719,220 B2 | 5/2010 | Newman, Jr. | |
| 7,737,577 B2 | 6/2010 | Langlois et al. | |
| 7,859,874 B2 | 12/2010 | Bovitz | |
| 7,868,478 B2 | 1/2011 | Newman, Jr. | |
| 7,906,866 B2 | 3/2011 | Anghel et al. | |
| 8,098,040 B1* | 1/2012 | Botto ............ | B60L 8/006 290/44 |
| 8,437,888 B2 | 5/2013 | Bibaut | |
| 8,698,444 B2 | 4/2014 | Malkin et al. | |
| 9,318,625 B2* | 4/2016 | Gatzke ............ | B64D 41/00 |
| 9,327,600 B1* | 5/2016 | Nehmeh ............ | B60L 1/00 |
| 2002/0060914 A1* | 5/2002 | Porter ............ | E02D 7/26 363/21.01 |
| 2003/0093187 A1* | 5/2003 | Walker ............ | B64C 13/20 701/1 |
| 2004/0119454 A1 | 6/2004 | Chang et al. | |
| 2004/0129835 A1* | 7/2004 | Atkey ............ | B64D 13/06 244/118.5 |
| 2006/0071123 A1* | 4/2006 | Nguyen ............ | B64D 41/00 244/76 R |
| 2006/0260323 A1* | 11/2006 | Moulebhar ............ | F01D 21/003 60/793 |
| 2008/0100135 A1 | 5/2008 | Lazarovich et al. | |
| 2008/0100136 A1 | 5/2008 | Langlois et al. | |
| 2008/0110193 A1* | 5/2008 | Jonqueres ............ | B64D 13/06 62/331 |
| 2008/0111420 A1 | 5/2008 | Anghel et al. | |
| 2008/0174177 A1 | 7/2008 | Langlois et al. | |
| 2008/0211237 A1 | 9/2008 | Berenger | |
| 2008/0238191 A1 | 10/2008 | Cottingham et al. | |
| 2009/0070091 A1* | 3/2009 | Hanke ............ | B64D 41/00 703/18 |
| 2009/0195066 A1 | 8/2009 | Tanaka | |
| 2009/0226770 A1* | 9/2009 | Manabe ............ | H01M 8/04567 429/431 |
| 2009/0286651 A1 | 11/2009 | Tanaka et al. | |
| 2009/0302153 A1 | 12/2009 | Matasso et al. | |
| 2010/0021778 A1* | 1/2010 | Steinshnider ...... | B01D 19/0042 429/419 |
| 2010/0123426 A1* | 5/2010 | Nashiki ............ | H02K 1/12 318/701 |
| 2010/0156173 A1 | 6/2010 | Nierlich et al. | |
| 2010/0156174 A1 | 6/2010 | Nierlich et al. | |
| 2010/0164458 A1 | 7/2010 | Pollard | |
| 2010/0171365 A1 | 7/2010 | Cottingham, III et al. | |
| 2010/0187903 A1 | 7/2010 | Diab et al. | |
| 2010/0193630 A1* | 8/2010 | Duces ............ | H02J 3/02 244/58 |
| 2010/0201190 A1 | 8/2010 | Pereira | |
| 2010/0252691 A1 | 10/2010 | Malkin et al. | |
| 2010/0270858 A1 | 10/2010 | Foch et al. | |
| 2010/0277960 A1 | 11/2010 | Cottingham et al. | |
| 2010/0283319 A1 | 11/2010 | Boudyaf et al. | |
| 2011/0022249 A1 | 1/2011 | Bibaut | |
| 2011/0210606 A1 | 9/2011 | Selker | |
| 2011/0210607 A1 | 9/2011 | Bauer et al. | |
| 2011/0273011 A1 | 11/2011 | de Wergifosse | |
| 2011/0273012 A1 | 11/2011 | Tardy | |
| 2012/0007551 A1 | 1/2012 | Song et al. | |
| 2012/0025604 A1 | 2/2012 | Baumann et al. | |
| 2012/0086266 A1 | 4/2012 | Shipley et al. | |
| 2012/0091967 A1 | 4/2012 | Kawamoto et al. | |
| 2012/0280091 A1* | 11/2012 | Saiz ............ | B64C 27/26 244/7 R |
| 2012/0291426 A1* | 11/2012 | Loison ............ | B64D 13/06 60/327 |
| 2012/0318914 A1* | 12/2012 | Rajashekara ....... | B64D 41/00 244/58 |
| 2013/0002015 A1* | 1/2013 | Gatzke ............ | B64D 41/00 307/9.1 |
| 2013/0087109 A1* | 4/2013 | Naitoh ............ | F02K 7/067 123/26 |
| 2013/0109317 A1* | 5/2013 | Kikuchi ............ | H04B 7/24 455/41.2 |
| 2013/0139521 A1* | 6/2013 | Massey ............ | B64D 37/32 60/782 |
| 2013/0327014 A1* | 12/2013 | Moulebhar ............ | F02K 3/065 60/226.2 |
| 2014/0032002 A1* | 1/2014 | Iwashima ............ | G05B 13/02 700/295 |
| 2014/0103158 A1* | 4/2014 | Berry ............ | B64C 29/0025 244/2 |
| 2014/0152110 A1 | 6/2014 | Sugimoto et al. | |
| 2014/0197681 A1* | 7/2014 | Iwashima ............ | B60R 16/03 307/9.1 |
| 2014/0291993 A1* | 10/2014 | Matsuo ............ | F01D 15/10 290/40 R |
| 2014/0298820 A1* | 10/2014 | Yamasaki ............ | F02C 7/08 60/778 |
| 2014/0333127 A1* | 11/2014 | Edwards ............ | H02J 4/00 307/9.1 |
| 2014/0338352 A1* | 11/2014 | Edwards ............ | F02C 3/113 60/774 |
| 2015/0060601 A1* | 3/2015 | Nakagawa ............ | B64C 13/50 244/99.2 |
| 2015/0232204 A1* | 8/2015 | Alexander ............ | B64C 15/00 244/171.1 |
| 2016/0031564 A1* | 2/2016 | Yates ............ | B64D 33/00 307/9.1 |
| 2016/0190622 A1* | 6/2016 | Whyatt ............ | H01M 8/0662 429/423 |

OTHER PUBLICATIONS

Homeyer, W. et al., "Advanced Power Converters for More Electric Aircraft Applications," Proceedings of the 31st Intersociety Energy Conversion Engineering Conference, vol. 1, Aug. 11, 1996, 6 pages.

Singh, B. et al., "An Input Current Waveshaping AC-DC Converter for Rectifier Loads," Journal of Power Electronics, vol. 8, No. 1, Jan. 2008, 23 pages.

TCW Technologies, LLC., "Intelligent Power Stabilizer, Modes: IPS-12v-4a, IPS-12v-8a," Mar. 2010, 13 pages.

Moussa, M. et al., "Stabilized Power AC-DC-AC Converter Using Polygon Transformer," Proceedings of the 2011 International Conference on Renewable Energies and Power Quality, Apr. 13, 2011, 6 pages.

Sekhar, C. et al., "Power-Quality Improvement by Multi Pulse AC-DC Converters for Varying Loads," International Journal of Scientific & Engineering Research, vol. 2, No. 12, Dec. 2011, 8 pages.

Brombach, J. et al., "Optimizing the Weight of an Aircraft Power Supply System through a +/− 270 VDC Main Voltage," Przeglad Elektrotechniczny (Electrical Review), vol. 88, No. 1a, Jan. 2012, 10 pages.

United States Patent and Trademark Office, Office Action Issued in U.S. Appl. No. 13/561,670, dated Dec. 5, 2014, 22 pages.

(56) References Cited

OTHER PUBLICATIONS

International Bureau of WIPO, International Preliminary Report on Patentability Issued in Application No. PCT/US2013/052596, dated Feb. 12, 2015, WIPO, 8 pages.
Korean Intellectual Property Office, International Search Report of PCT/US2013/052596, WIPO, dated May 14, 2014, 3 pages.
State Intellectual Property Office of the People's Republic of China, Office Action and Search Report Issued in Application No. 201380039141.8, dated Jun. 13, 2016, 8 pages. (Submitted with Translation of Search Report).

* cited by examiner

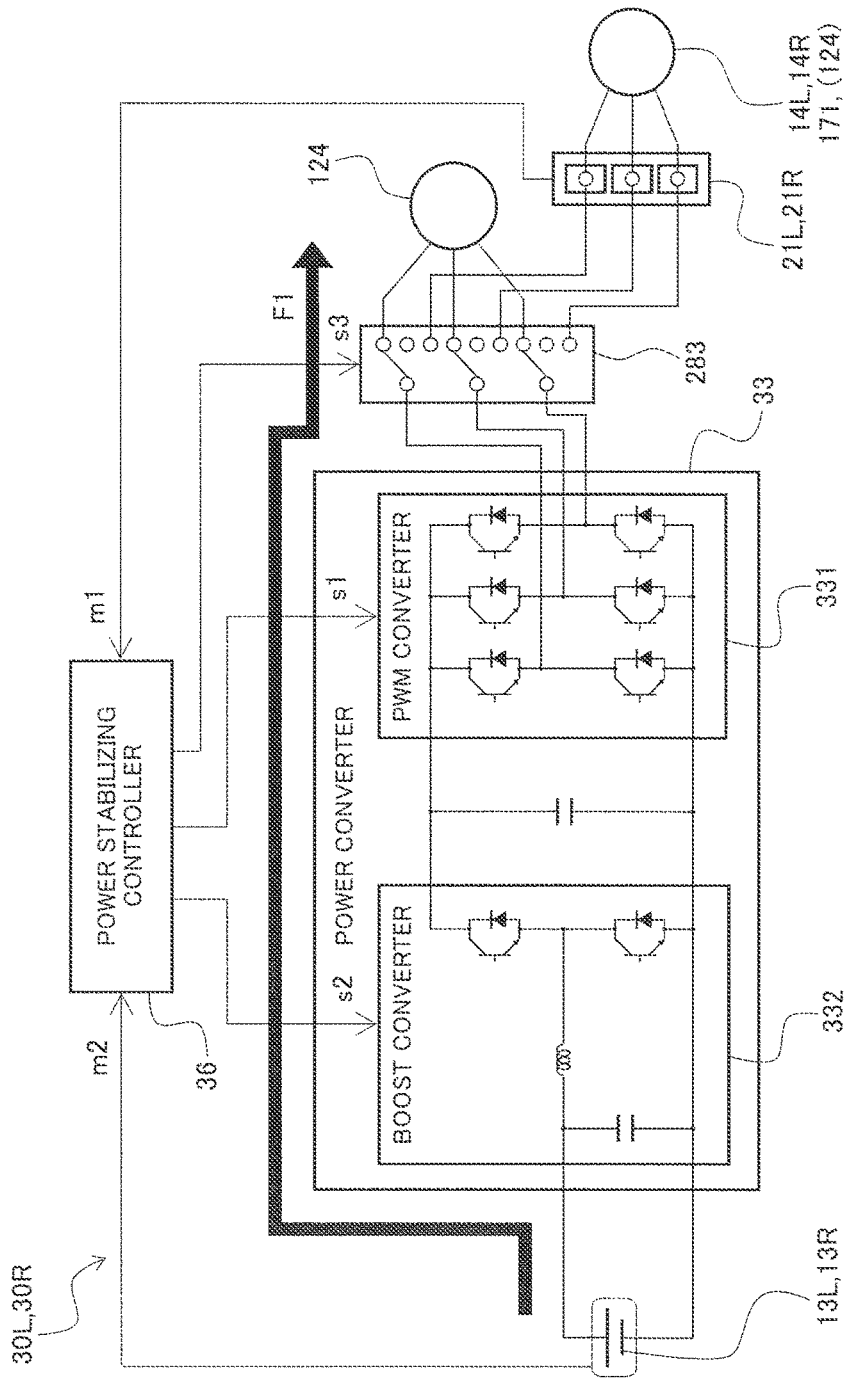

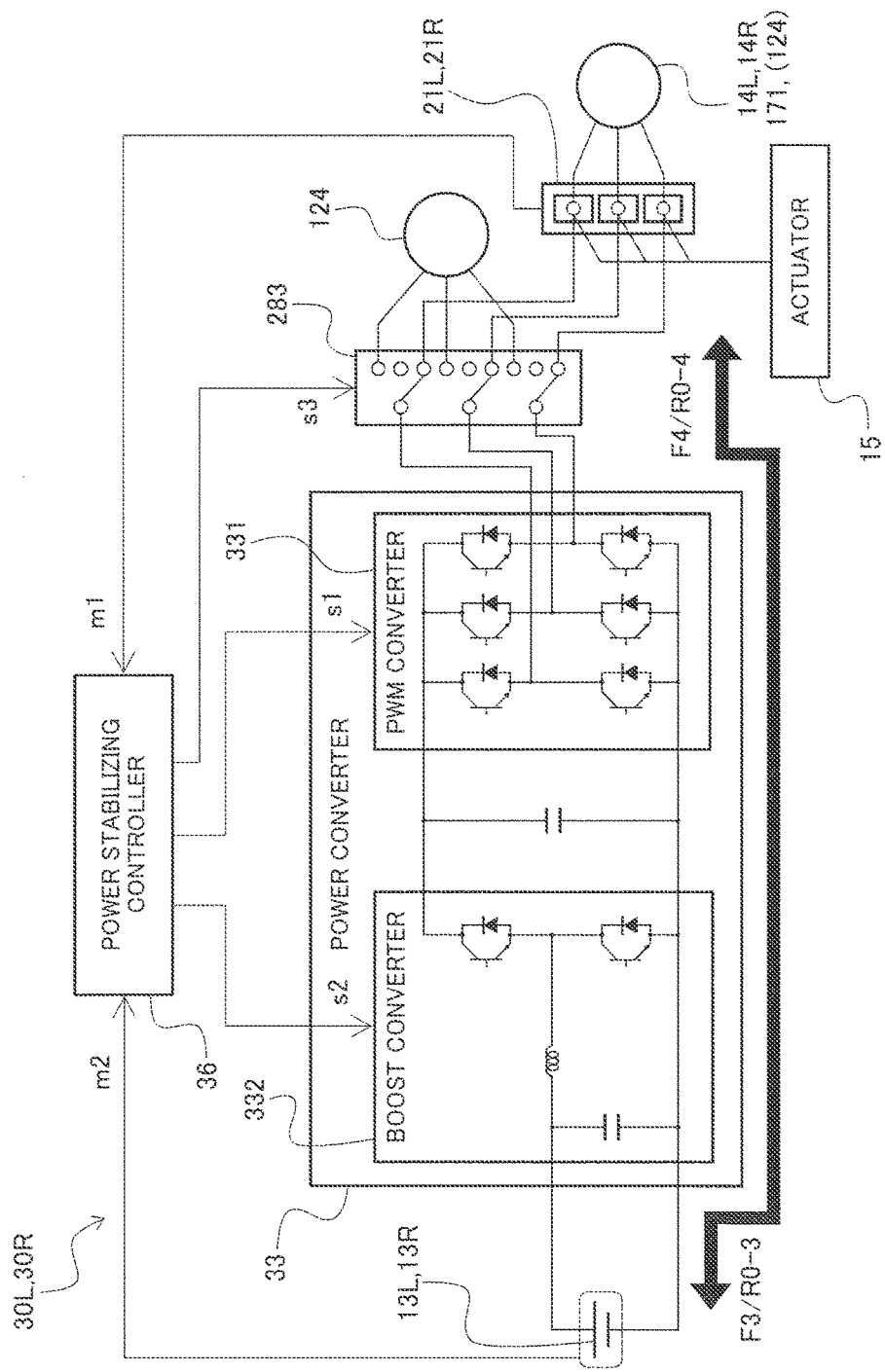

SYSTEM AND METHOD FOR STABILIZING AIRCRAFT ELECTRICAL SYSTEMS

TECHNICAL FIELD

The present invention relates to an electric system stabilizing system for an aircraft. Particularly, the present invention relates to an electric system stabilizing system for an aircraft, which is capable of stabilizing an electric system which includes an AC power supply and a DC power supply and is electrically driven mainly by AC power.

BACKGROUND ART

Typically, as power systems for an aircraft, three kinds of systems, which are a hydraulic system, a breed air system, and an electric system, are incorporated into the aircraft. The hydraulic system is employed for the operation of landing gears, control surfaces, etc. The breed air system is employed for the operation of air conditioning devices, pressure application devices, de-icing devices, and others, in the interior of the aircraft. The electric system is employed for the operation of electric devices and electronic devices. In recent years, there has been a trend that at least a portion of the hydraulic system and a portion of the breed air system are replaced by the electric system having a higher efficiency. For example, as actuators (including an actuator for controlling the control surface) mounted to the aircraft, electric (electrically driven) actuators have been widely used, instead of conventional hydraulic (hydraulically powered) actuators. The aircraft in which the hydraulic system, the breed air system, and other system are replaced as much as possible by the electric system, is typically named MEA (more electric aircraft).

It is known that with a progress of the MEA, a change (fluctuation) in a power supply voltage tends to occur, and the electric system tends to be unstable. For example, in the case of the electric actuator, great regenerative power is generated in a driving motor, and thereby a voltage in the electric system rises significantly temporarily (for a certain time). In addition, the electric power is returned to a generator provided in an engine, and thereby an engine gear box might be adversely affected due to back rush. Or, if power loads supplied with the electric power from the electric system, (devices mounted in the aircraft and supplied with electric power from the electric system) increase temporarily, a significant voltage decrease (drop) might be generated.

It is known that in the electric system in which the MEA has progressed, various configurations are employed to address the above stated voltage increase or voltage decrease (drop). For example, it is known that to address regenerative power from the actuator, a resistor is built into a controller of the actuator. In accordance with this configuration, the regenerative power from a driving motor is converted into heat by the resistor and consumed, which prevents the regenerative power from returning to the electric system. It is also known that to address a voltage decrease due to a temporary increase in power loads, an AC power generator having a power generation capacity made greater according to the voltage decrease is employed.

However, in the above stated conventional configurations, a weight of the aircraft might probably increase. For example, in the former configuration, a large-sized resistor is required to adequately consume the great regenerative power. Therefore, the size of the controller of the actuator increases and heat generated increases, which causes a need for a large-sized heat radiator. Because of incorporation of the large-sized controller and the large-sized heat radiator into the aircraft, the weight of the aircraft increases. In the latter configuration, the size of the AC power generator increases due to the increase in the power generation capacity, and therefore, the weight of the aircraft increases. Moreover, in the former configuration, although the heat radiator is provided, unnecessary heat generation occurs. Therefore, it is required that the controller be designed in view of an influence of the heat generation.

Accordingly, for example, Patent Literature 1: US Patent Publication NO. 2009/0302153 discloses an electric system in which surplus electric power such as regenerative power is absorbed or deficient electric power due to a voltage decrease is made up for, by using a DC power supply such as a battery and a capacitor, in a small-sized aircraft.

CITATION LIST

Patent Literature

Patent Literature 1: US Patent Publication NO. 2009/0302153

SUMMARY OF INVENTION

Technical Problem

As shown in FIG. 14, in an electric system of a typical commercial aircraft, AC power of AC115V and a constant frequency of 400 Hz, or AC power of AC230V and a variable frequency of 360 to 800 Hz, is mainly used. By comparison, in the electric system disclosed in Patent Literature 1, DC power of 270V is mainly used as represented by a regenerative power (150~200 kW) of an actuator of a combat plane as a typical example. Although Patent Literature 1 describes that an application to AC power of 115V may be made but does not explicitly disclose a specific configuration of this. Therefore, the electric system disclosed in Patent Literature 1 intended for an electric system which is electrically driven mainly by DC cannot be applied without some modification to an electric system which is electrically driven mainly by AC.

The present invention has been developed to solve the above described problems, and an object of the present invention is to provide an electric system stabilizing system for an aircraft, which is capable of favorably stabilizing an electric system while avoiding a weight increase, in an aircraft including the electric system which is electrically driven mainly by AC power.

Solution to Problem

To solve the above stated problems, according to the present invention, there is provided an electric system stabilizing system for aircraft, comprising at least: an electric system including a DC power supply and an AC power supply as an electric power supply device, and an AC power supply bus connected to the AC power supply, the electric system being configured to supply electric power to at least one electric device mounted in the aircraft; and a power stabilizing device connected to the AC power supply bus and to the DC power supply, to stabilize an output of the electric power supply device; wherein the DC power supply is configured to absorb regenerative power from the electric device and transiently supply electric power to the electric device; the power stabilizing device includes: a power converter section including a PWM (Pulse Width Modulation) converter; and a power stabilizing control section for controlling the power converter section; and the power stabilizing control section monitors at least one of a change in a voltage and a change in a frequency in the AC power supply bus, and controls charging/discharging of the DC power supply according to a result of the monitoring, to stabilize the electric system.

In the electric system stabilizing system for aircraft having the above configuration, the aircraft may include an auxiliary power unit (APU) and a ram air turbine (RAT); the electric system may include as the AC power supply: an APU starter/generator mounted to the auxiliary power unit and configured to generate AC power; an AC power generator mounted to the engine; and a RAT generator mounted to the ram air turbine; the electric system may include as the DC power supply, at least one of a secondary battery and a capacitor; the DC power supply and the APU starter/generator may be each connected to the power stabilizing device; the AC power generator and the RAT generator may be connected to the power stabilizing device via the AC power supply bus; and the APU starter/generator may be connected to the power stabilizing device via the AC power supply bus.

In the electric system stabilizing system for aircraft having the above configuration, the electric system may include a power supply relay via which the power converter section is connected to the auxiliary power unit or to the AC power generator; wherein in a state in which the auxiliary power unit is deactivated and the power converter section is connected to the APU starter/generator by switching of the power supply relay, the power stabilizing control section may cause the power converter section to convert the DC power from the DC power supply into the AC power and supply the AC power to the APU starter/generator, to start the auxiliary power unit.

In the electric system stabilizing system for aircraft having the above configuration, the electric system may include a power supply relay via which the power converter section is connected to the APU starter/generator or to the AC power generator; wherein in a state in which the DC power supply is in a chargeable state and the power converter section is connected to the AC power generator or the APU starter/generator by switching of the power supply relay, the power stabilizing control section may cause the power converter section to convert the AC power from the AC power generator or the APU starter/generator into the DC power and supply the DC power to the DC power supply, to charge the DC power supply.

In the electric system stabilizing system for aircraft having the above configuration, the at least one electric device may be connected to the AC power supply bus, in a state in which the AC power is not supplied from the AC power generator to the electric device via the AC power supply bus, the power stabilizing control section may cause the power converter section to convert the DC power from the DC power supply into the AC power and supply the AC power to the electric device via the AC power supply bus for a specified time period.

In the electric system stabilizing system for aircraft having the above configuration, the electric system may include: an essential bus supplied with the electric power from the AC power generator via the AC power supply bus and having a lower rated voltage than the DC power supply; and a voltage converter interposed between the essential bus and the DC power supply; wherein the DC power supply may be always connected to the essential bus via the power converter section; and wherein in a state in which the AC power is not supplied from the AC power generator to the essential bus, the electric power may be supplied to the essential bus without cut-off.

In the electric system stabilizing system for aircraft having the above configuration, in a state in which the AC power generator is deactivated and the AC power is supplied from the RAT generator into the AC power supply bus, the power stabilizing control section may cause the power converter section to convert the AC power from the RAT generator to the DC power and supply the DC power to the essential bus.

In the electric system stabilizing system for aircraft having the above configuration, the aircraft may include one auxiliary power unit and at least one engine provided with the AC power generator, at each of right and left sides; the AC power supply bus may include an AC power supply bus provided at the left side and connected to the AC power generator provided at the left side, and an AC power supply bus provided at the right side and connected to the AC power generator provided at the right side; wherein the electric system may include two electric systems which are: a left electric system including the AC power generator provided at the left side, the AC power supply bus provided at the left side, the DC power supply, the power stabilizing device, and the essential bus; and a right electric system including the AC power generator provided at the right side, the AC power supply bus provided at the right side, the DC power supply, the power stabilizing device, and the essential bus; and the right and left AC power supply buses may be connected to each other via a power supply relay, the right and left AC power supply buses may be connected to the APU starter/generator via power supply relays; and the right and left essential buses may be connected to each other via a power supply relay.

In the electric system stabilizing system for aircraft having the above configuration, the power stabilizing control section may measure at least one of the voltage and the frequency in the AC power supply bus and determines that a first-order lag value of a measurement value of at least one of the voltage and the frequency is a target value in control; and the power stabilizing control section may control charging/discharging of the DC power supply based on a difference between the target value and the measurement value.

In the electric system stabilizing system for aircraft having the above configuration, the power stabilizing control section may monitor a state of charge (SOC) of the DC power supply and may make compensation for a charging/discharging amount of the DC power supply based on a difference between a measurement value of the SOC and a preset target value of a charging rate.

In the electric system stabilizing system for aircraft having the above configuration, the power stabilizing control section may multiply a difference between the target value and the measurement value by a proportional constant preset for the active power or the reactive power, to generate a power command signal of the active power or a power command signal of the reactive power; the power stabilizing control section may generate an active power compensation value from a difference between a measurement value of a SOC of the DC power supply and a preset target value of the SOC; the power stabilizing control section may add the active power compensation value to a base value which is the generated power command signal of the active power to generate a final value of the power command signal of the active power; and the power stabilizing control section may control charging/discharging of the DC power supply based on the power command signal of the reactive power and the final value of the power command signal of the active power.

In the electric system stabilizing system for aircraft having the above configuration, the power stabilizing control section may add to the base value of the power command signal of the active power, the active power compensation value and an overload compensation value preset to supply auxiliary electric power from the DC power supply to the AC power supply bus, to generate a final value of the power command signal of the active power.

In the electric system stabilizing system for aircraft having the above configuration, when the AC power generated in the AC power supply has a variable frequency, the power stabilizing control section may cause the power converter section to charge the DC power supply with active power in proportion to an increase in the voltage, to output reactive power with a leading power factor in proportion to the increase in the voltage, or to charge the DC power supply with the active power in proportion to the increase in the voltage and output the reactive power with the leading power factor in proportion to the increase in the voltage, if the increase in the voltage is monitored; and wherein the power stabilizing control section may cause the power converter section to discharge the active power from the DC power supply in proportion to a decrease in the voltage, to output the reactive power with a lagging power factor in proportion to the decrease in the voltage, or to discharge the active power from the DC power supply in proportion to the decrease in the voltage and output the reactive power with the lagging power factor in proportion to the decrease in the voltage, if the decrease in the voltage is monitored.

In the electric system stabilizing system for aircraft having the above configuration, when the AC power generated in the AC power supply has a constant frequency; the power stabilizing control section may cause the power converter section to charge the DC power supply with active power, in proportion to an increase in the frequency if the increase in the frequency is monitored; and wherein the power stabilizing control section causes the power converter section to discharge the active power from the DC power supply in proportion to the decrease in the frequency if a decrease in the frequency is monitored.

In the electric system stabilizing system for aircraft having the above configuration, when the AC power generated in the AC power supply has a constant frequency, the power stabilizing control section may cause the power converter section to output reactive power of a leading power factor in proportion to an increase in the voltage if the increase in the voltage is monitored; and the power stabilizing control section may cause the power converter section to output reactive power of a lagging power factor in proportion to a decrease in the voltage if the decrease in the voltage is monitored.

In the electric system stabilizing system for aircraft having the above configuration, the electric device may be an actuator for controlling a control surface.

The electric system stabilizing system for aircraft, in the aircraft having the above configuration, at least either a hydraulic system or a breed air system may be electrically driven; the electric system may include a DC power supply bus connected to a controller of the electric device; and a controller of the hydraulic system or breed air system which is electrically driven, is connected to the DC power supply bus.

To solve the above stated problems, according to the present invention, there is provided a method of stabilizing an electric system for aircraft, the electric system including a DC power supply and an AC power supply as an electric power supply device, and an AC power supply bus connected to the AC power supply, the electric system being configured to supply electric power to at least one electric device mounted in the aircraft; the method comprising: using as the DC power supply, a DC power supply configured to absorb regenerative power from the electric device and transiently supply electric power to the electric device; and monitoring at least one of a change in a voltage and a change in a frequency in the AC power supply bus and controlling charging/discharging of the DC power supply based on a result of the monitoring, thereby stabilizing the electric system.

The above and further objects, features and advantages of the present invention will more fully be apparent from the following detailed description of preferred embodiments with reference to accompanying drawings.

Advantageous Effects of the Invention

As described above, according to the present invention, it achieves an advantageous effect that provide an electric system stabilizing system for an aircraft, which is capable of favorably stabilizing an electric system while avoiding a weight increase, in an aircraft including the electric system which is electrically driven mainly by AC power.

BRIEF DESCRIPTION OF DRAWINGS

FIG. 3 is a schematic block diagram showing main components in the electric system stabilizing system for the aircraft of FIG. 1 and showing an exemplary state in which an APU is started by the AC power stabilizing device of FIG. 2.

FIG. 4 is a schematic block diagram showing major components in the electric system stabilizing system for the aircraft of FIG. 2 and showing an exemplary state in which charging/discharging of a secondary battery is controlled by the AC power stabilizing device of FIG. 2.

DESCRIPTION OF EMBODIMENTS

Figure 1:
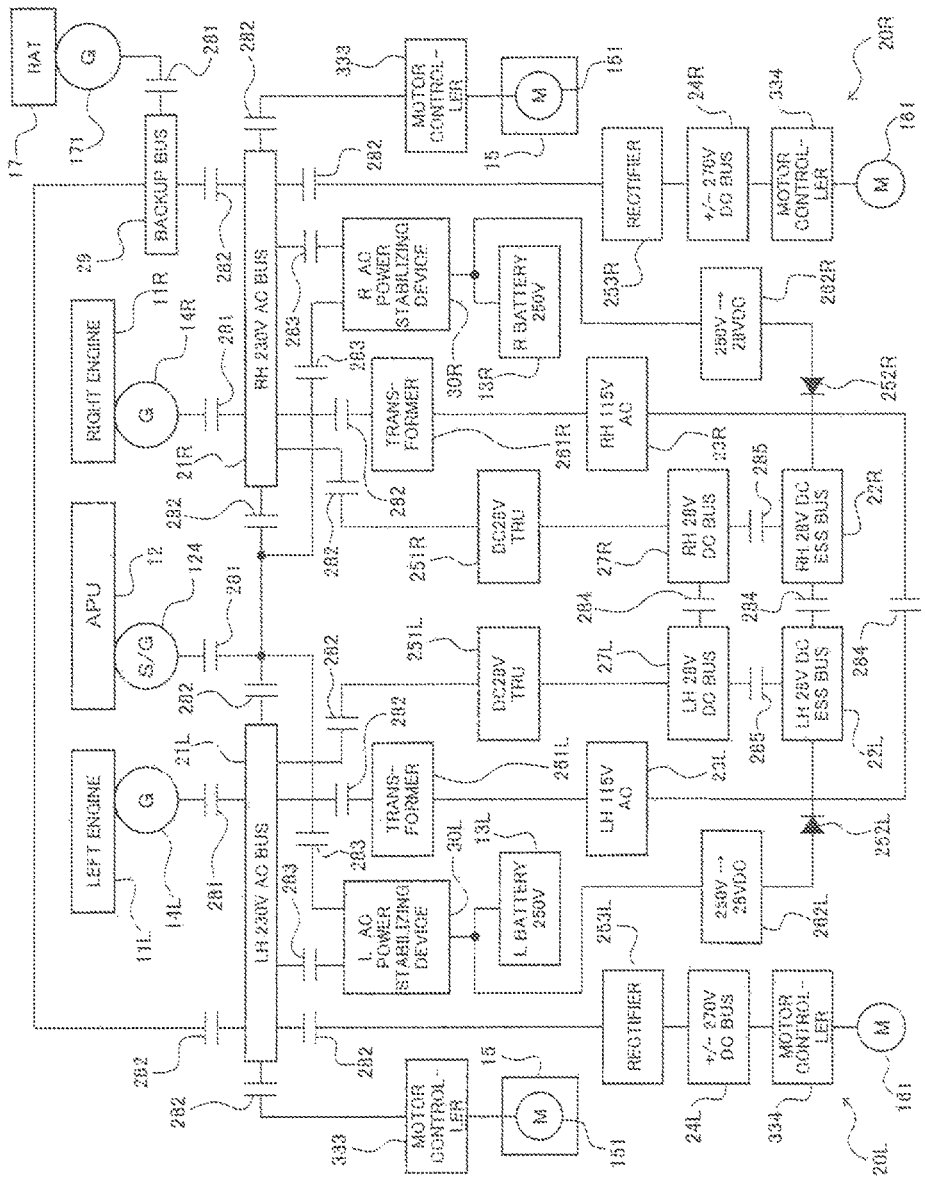
FIG. 1 is a schematic block diagram showing an exemplary configuration of an electric system stabilizing system for an aircraft according to an embodiment of the present invention.

Hereinafter, preferred embodiments of the present invention will be described with reference to the drawings. Throughout the drawings, the same or corresponding components are designated by the same reference numerals and will not be described in repetition.

[Overall Configuration of Electric System Stabilizing System for Aircraft]

First of all, an exemplary overall configuration of an electric system stabilizing system for an aircraft according to Embodiment 1 of the present invention will be described specifically with reference to FIG. 1.

The electric system stabilizing system for the aircraft according to the present embodiment is incorporated into the aircraft including electric systems which are electrically driven mainly by AC. The aircraft may be configured such that the electric system which is one of power systems is electrically driven mainly by AC or at least one of a hydraulic system and a breed air system is electrically driven mainly by AC in addition to the electric system.

Or, the aircraft of the present embodiment may be configured such that only a portion of the hydraulic system, only a portion of the breed air system, or only a portion of the hydraulic system and a portion of the breed air system are electrically driven mainly by AC. For example, as a configuration in which only a portion of the hydraulic system is electrically driven, a portion or entire of at least an actuator (hereinafter simply referred to as "control surface actuator" for easier explanation) used for controlling the control surface may be electrically driven.

As shown in FIG. 1, the aircraft of the present embodiment includes a left engine 11L, a right engine 11R, an auxiliary power unit (APU) 12 and a ram air turbine (RAT) 17. The left engine 11L and the right engine 11R are propulsive engines of the aircraft, and include an AC power generator 14L and an AC power generator 14R, respectively.

The APU 12 is an auxiliary power source provided separately from the engines 11L, 11R. The APU 12 is actuated by combustion of a fuel like the engines 11L, 11R. The APU 12 also includes an APU starter/generator 124 as an AC power generator. The RAT 17 is an auxiliary power source provided separately from the APU 12. The RAT 17 is stored in the interior of the aircraft during a normal state and is deployed outside the aircraft in emergencies, etc. The RAT 17 deployed outside the aircraft is actuated by an air flow (flight wind) generated by the flight of the aircraft. The RAT 17 includes a RAT generator 171 as an AC power generator.

The APU 12 is used to activate the left engine 11L and the right engine 11R as described later in addition to the use as the power source in emergencies. By comparison, the RAT 17 is fundamentally a power source in emergencies, and is configured to supply necessary and minimum electric power to enable the aircraft to fly in safety in emergencies.

As shown in FIG. 1, the electric system stabilizing system for the aircraft of the present embodiment, which is applied to the aircraft, includes at least, a left electric system 20L, a right electric system 20R, an AC power stabilizing device 30L connected to the left electric system 20L, a secondary battery 13L connected to the left electric system 20L, an AC power stabilizing device 30R connected to the right electric system 20R, and a secondary battery 13R connected to the right electric system 20R.

The left electric system 20L includes as power supply devices, the AC power generator 14L of the left engine 11L, the APU starter/generator 124 of the APU 12, the RAT generator 171 of the RAT 17, and the secondary battery 13L. The right electric system 20R includes as power supply devices, the AC power generator 14R of the right engine 11R, the APU starter/generator 124, the RAT generator 171, and the secondary battery 13R.

Among the above mentioned power supply devices, as shown in FIG. 1, the APU starter/generator 124 is configured to be directly connectable to both of the left electric system 20L and the right electric system 20R. As shown in FIG. 1, the RAT generator 171 is configured to be directly connectable to both of the left electric system 20L and the right electric system 20R via a backup bus 29.

Therefore, in the present embodiment, each of the left electric system 20L and the right electric system 20R includes four power supply devices in total, which are three AC power supplies and one DC power supply.

The configuration of the left electric system 20L, of the two electric systems, will now be described. The AC power generator 14L in the left electric system 20L is connected to a primary AC power supply bus (primary AC bus) 21L via a primary power supply relay 281. The primary AC bus 21L is connected to the APU starter/generator 124, a transformer/rectifier (TRU) 251L, a transformer 261L, a rectifier 253L, and a motor controller 333, via secondary power supply relays 282, respectively. The AC power stabilizing device 30L is connected to the primary AC bus 21L via starting switch relay 283. Therefore, the AC power generator 14L is able to supply AC power to the AC power stabilizing device 30L, the transformer/rectifier (TRU) 251L, the transformer 261L, the rectifier 253L, and the motor controller 333, via the primary AC bus 21L.

The APU starter/generator 124 is connected to the primary AC bus 21L via the primary power supply relay 281 and the secondary power supply relay 282. The RAT generator 171 is connected to the backup bus 29 via the primary power supply relay 281. The backup bus 29 is connected to the primary AC bus 21L via the secondary power supply relay 282. Therefore, the primary AC bus 21L can be supplied with AC power from the APU starter/generator 124 or the RAT generator 171 as well as from the AC power generator 14L.

Furthermore, the AC power stabilizing device 30L is also connected to the APU starter/generator 124 without connecting via the primary AC power supply bus 21L. Specifically, as shown in FIG. 1, the AC power stabilizing device 30L is connected to the primary AC bus 21L via one of starting switch relays (first starting switch relay) 283. Therefore, the AC power stabilizing device 30L is connected to the APU starter/generator 124 via a path (in FIG. 1, path including the first starting switch relay 283, the primary AC bus 21L, the secondary power supply relay 282, and the primary power supply relay 281) including the primary AC bus 21L. This path is referred to as "normal path" for easier description. The AC power stabilizing device 30L is also connected to the APU starter/generator 124 via a path including the other (second) starting switch relay 283 (in FIG. 1, path including the other starting switch relay 283 and the primary power supply relay 281), in addition to the normal path. This path is referred to as "starting path" for easier description.

The AC power stabilizing device 30L is connected to the secondary battery 13L. The secondary battery 13L is connected to an essential bus 22L via a voltage converter 262L and a rectifier element 252L. The transformer/rectifier 251L is connected to the DC power supply bus (DC bus) 27L. The essential bus 22L is connected to the DC bus 27L via the DC power supply switch relay 285.

In accordance with this configuration, the essential bus 22L can be supplied with the electric power from the AC power supplies (AC power generator 14L, or APU starter/generator 124) via the path including the primary AC bus 21L, and the electric power from the DC power supply (secondary battery 13L) via the path including the voltage converter 262L. The transformer 261L is connected to the secondary AC power supply bus (secondary AC bus) 23L.

The motor controller 333 is connected to the primary AC bus 21L and controls a motor (control surface actuator motor) 151 included in a control surface actuator 15. A DC power supply bus (DC bus) 24L is connected to the primary AC bus 21L via the above stated rectifier 253L. A motor controller 334 is connected to the DC bus 24L. The motor controller 334 controls great power loads in the aircraft, for example, a motor of an air-conditioning compressor, a motor of a hydraulic pump, etc.

In FIG. 1, for easier description, the motor of the air-conditioning compressor, the motor of the hydraulic pump, etc., are collectively depicted as a typical one ("hydraulic/air-conditioning motor 161"). Also, in FIG. 1, a typical one is depicted as the control surface actuator 15 (and control surface actuator motor 151).

As shown in FIG. 1, the configuration of the right electric system 20R is the same as the above stated configuration of the left electric system 20L. That is, the right electric system 20R includes the AC power generator 14R (AC power supply) and the secondary battery 13R (DC power supply) as the power supply devices and shares the APU starter/generator 124 and the RAT generator 171 with the left electric system 20L. The right electric system 20R includes as power supply buses, the primary AC bus 21R, the essential bus 22R, the secondary AC bus 23R, and the DC bus 27R as the power supply buses, and the AC power stabilizing device 30R.

The AC power generator 14R is connected to the primary AC bus 21R via the primary power supply relay 281. The APU starter/generator 124 is connected to the primary AC bus 21R via the secondary power supply relay 282 and the primary power supply relay 281. The primary AC bus 21R is connected to the RAT generator 171 via the secondary power supply relay 282, the backup bus 29 and the primary power supply relay 281. As described above, the AC power stabilizing device 30R is connected to the primary AC bus 21R via the normal path (path including first starting switch relay 283) and to the APU starter/generator 124 (and primary AC bus 21R) via the starting path (path including the second starting switch relay 283).

In addition to the above stated power supply devices, the above stated power supply buses, and the AC power stabilizing device 30R, the right electric system 20R includes components, referred to as "transformer/rectifier components" for easier description), which perform transformation, rectification, etc., such as a TRU 251R, a rectifier element 252R, a rectifier 253R, a transformer 261R, and a voltage converter 262R. These transformer/rectifier components are connected to the primary AC bus 21R or to other components (power supply buses, power supply devices) so as to have the same configuration as that of the left electric system 20L. The motor controller 333 is connected to the primary AC bus 21R via the secondary power supply relay 282. The motor controller 334 is connected to the rectifier 253R via the DC bus 24R. No more detailed description of the configuration of the right electric system 20R will be given.

The left electric system 20L and the right electric system 20R are configured in such a manner that the essential buses 22L, 22R are connected together via a right-left connection relay 284, the secondary AC buses 23L, 23R are connected together via a right-left connection relay 284, and the DC buses 27L, 27R are connected together via a right-left connection relay 284. Each of the left electric system 20L and the right electric system 20R is operative independently as the electric system. If power generation in one of the electric systems stops, the electric power can be supplied to the other electric system by switching of the right-left connection relays 284 present between the power supply buses.

Since the left electric system 20L and the right electric system 20R can be connected together as described above, the electric power can be supplied from the AC power generator 14L which is the AC power supply in the left electric system 20L to the right electric system 20R, and the electric power can be supplied from the secondary battery 13L which is the DC power supply in the left electric system 20L to the right electric system 20R. The electric power is supplied from the right electric system 20R to the left electric system 20L in the same manner. Since the APU starter/generator 124 and the RAT generator 171 are connected to both of the left electric system 20L and the right electric system 20R, they are able to supply the electric power to both of the left electric system 20L and the right electric system 20R.

In the electric systems 20L, 20R, the primary AC buses 21L, 21R are connected together, the APU starter/generator 124 is connected to the primary AC buses 21L, 21R, the essential buses 22L, 22R are connected together, and the secondary AC buses 23L, 23R are connected together. Thus, as the electric system in the aircraft, a double redundancy system in which the electric systems 20L, 20R are connected together is constructed. In this construction, the electric power can be supplied from one of the electric systems to the other electric system. This can further improve reliability of the electric systems. Since the right-left connection relays 284 (two secondary power supply relays 282 between the primary AC buses 21L, 21R) are present between the electric systems 20L, 20R, the electric systems 20L, 20R are not always electrically connected together.

A basic path through which the electric power is supplied from the AC power supply in each of the electric systems 20L, 20R having the above configuration will be described in brief. All of three-phase AC power (referred to as "normal AC power" for easier description) from the AC power generators 14L, 14R, or the APU starter/generator 124 is supplied to the primary AC buses 21L, 21R. Therefore, the normal AC power is supplied to the power loads via the primary AC buses 21L, 21R.

During a flight of the aircraft, if a situation occurs, in which electric power cannot be supplied from any of the AC power generators 14L, 14R and the APU starter/generator 124, the RAT 17 is activated, and the RAT generator 171 starts generating electric power. Since the RAT generator 171 is connected to the primary AC buses 21L, 21R via the backup bus 29, three-phase AC power (referred to as "RAT AC power" for easier description) generated in the RAT generator 171 is supplied to the primary AC buses 21L, 21R via the backup bus 29.

At this time, the RAT AC power is supplied to power loads which are at least required to enable the aircraft to fly in safety, i.e., the control surface actuators 15 and electric devices connected to the essential buses 22L, 22R. Specifically, the RAT AC power is supplied to the control surface actuators 15 from the primary AC buses 21L, 21R via the motor controllers 333, respectively. As described later, the RAT AC power is converted into DC power by the AC power stabilizing devices 30L, 30R, and supplied to the essential buses 22L, 22R by way of the voltage converters 262L, 262R, and the rectifier elements 252L, 252R, respectively.

At this time, the RAT AC power is not supplied to, for example, the hydraulic/air-conditioning motor 161 which is another power load. Therefore, the secondary power supply relays 282 interposed between the rectifiers 253L, 253R and the primary AC buses 21L, 21R, are switched to a cut-off state, to cut off the RAT AC power.

[Components in Electric System]

Next, the power supply devices, the power supply buses and the transformer/rectifier components, etc., constituting the electric systems 20L, 20R, will be described specifically. Among the power supply devices, the AC power generators 14L, 14R which are one of the AC power supplies, are provided in the left engine 11L, and the right engine 11R, respectively, to generate the three-phase AC power, as described above. The voltage and frequency of the three-phase AC power are not particularly limited. In the present embodiment, as the AC power generators 14L, 14R, generators with a variable frequency (VF) may be used, or generators with a constant frequency (CF) may be used.

In a case where the AC power generators 14L, 14R are the VF generators, for example, its voltage may be 230 VAC, and its frequency may be 360~800 HzVF. Or, the voltage may be 115 VAC, and the frequency may be 360~800 HzVF. In this case, the transformers 261L, 261R, shown in FIG. 1, may be omitted. In a case where the AC power generators 14L, 14R are the CF generators, for example, its voltage may be 230 VAC, and its frequency may be 400 HzCF. Or, the voltage may be 115 VAC, and the frequency may be 400 HzCF. In this case, the transformers 261L, 261R may be omitted.

The APU starter/generator 124 which is one of the AC power supplies, is mounted to a micro gas turbine (not shown) included in the APU 12 and generates three-phase AC power like the AC power generators 14L, 14R. The micro gas turbine is constructed such that a turbine and a compressor are coupled together coaxially, and the APU starter/generator 124 is attached to a compressor shaft. The three-phase AC power generated in the APU starter/generator 124 is, in the present embodiment, 230 VAC in voltage and 400 HzCF in frequency, but may be 115 VAC in voltage and 400 HzCF in frequency.

The RAT generator 171 which is an AC power supply in emergencies is an AC power generator which generates electric power by rotation of a propeller of the RAT 17. The RAT generator 171 is configured to generate necessary and minimum three-phase AC power to enable the aircraft to fly in safety. The backup bus 29 connected to the RAT generator 171 is provided to supply the three-phase AC power from the RAT generator 171 to the primary AC buses 21L, 21R.

In the present embodiment, the primary AC buses 21L, 21R are power supply buses in which its rated voltage is 230 VAC. The primary AC buses 21L, 21R are provided to supply the three-phase AC power from the AC power generators 14L, 14R, the APU starter/generator 124 or the RAT generator 171, to the left electric system 20L and to the right electric system 20R.

The TRUs 251L, 251R convert the electric power of 230 VAC from the primary AC buses 21L, 21R into electric power of 28 VDC. The DC buses 27L, 27R are power supply buses used to supply the electric power of 28 VDC obtained by conversion by the TRUs 251L, 251R, to the essential buses 22L, 22R. In the present embodiment, the essential buses 22L, 22R are power supply buses in which its rated voltage is 28 VDC. The essential buses 22L, 22R are used to supply the electric power of 28 VDC obtained by conversion in the TRUs 251L, 251R, to control systems which are important in manipulation of the aircraft (e.g., display device or control device, etc., which are important in manipulation of the aircraft).

The transformers 261L, 261R decrease the voltage of the electric power of AC 230V from the primary AC buses 21L, 21R to 115 VAC. The secondary AC buses 23L, 23R are used to supply the electric power of 115 VAC obtained by voltage decrease in the transformers 261L, 261R, to the electric devices or electronic devices which are incorporated into the aircraft.

The AC power stabilizing device 30L is interposed between the AC power supply (AC power generator 14L) and the secondary battery 13L to regulate a voltage of the primary AC bus 21L, thereby stabilizing the electric system 20L. The AC power stabilizing device 30R is interposed between the AC power supply (AC power generator 14R) and the secondary battery 13R to regulate a voltage of the primary AC bus 21R, thereby stabilizing the electric system 20R. Its specific configuration will be described later. The secondary batteries 13L, 13R are DC power supplies of the electric systems 20L, 20R, respectively. In the present embodiment, the secondary batteries 13L, 13R have a rated voltage of 250V and a capacity of 10 AH (Ampere-Hour).

The secondary batteries 13L, 13R are configured to absorb regenerative power from a great power load (electric device, device built into aircraft) such as the control surface actuator 15 and transiently supply necessary electric power to the electric device. Specifically, the secondary batteries 13L, 13R may have a rated voltage which allows the regenerative power from the power load to be absorbed thereinto. In the present embodiment, the rated voltage is 250V as described above, but is not limited to this value. In the present embodiment, the capacity of the secondary batteries 13L, 13R is 10 AH as described above, but is not limited to this value.

Figure 14:
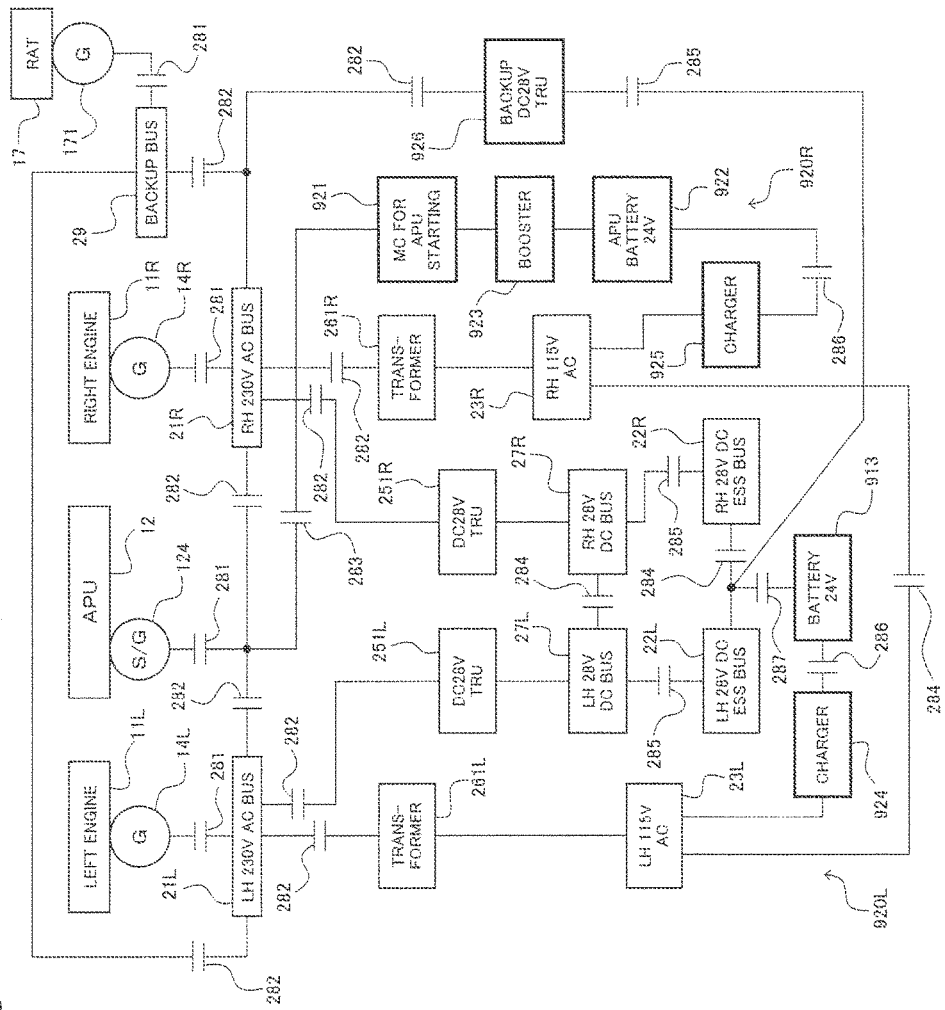
FIG. 14 is a schematic block diagram showing an exemplary configuration of a conventional general electric system for an aircraft.

For example, as described later, in an electric system of a conventional general aircraft, the rated voltage of the secondary battery is 24 VDC (see secondary battery 913 in FIG. 14). By comparison, for example, the rated voltage of the secondary batteries 13L, 13R of the present embodiment is 250V, and is substantially equal to the voltage (230 VAC) of the AC power generators 14L, 14R, or the voltage of the APU starter/generator 124.

Therefore, preferably, the rated voltage of the DC power supplies (secondary batteries 13L, 13R, capacitors described later, etc.) used in the present embodiment is at least about ten times (specifically, about 8 to 12 times) as large as the rated voltage of a secondary battery of a conventional general aircraft and is at least equal to (specifically, about 0.9 to 1.1 times) as large as the rated voltage of an AC power supply of the conventional general aircraft. The DC power supplies having such a rated voltage are able to absorb the regenerative power from the power loads and adequately address a voltage decrease (drop) due to overload as described later.

The DC power supplies are not limited to those having such a rated voltage or capacity. DC power supplies having a greater rated voltage or capacity may be used as necessary so long as the DC power supplies are able to absorb the regenerative power from the power loads.

The voltage converters 262L, 262R decrease 250 VDC from the secondary batteries 13L, 13R to 28 VDC. The rectifier elements 252L, 252R rectify the electric power of 28 VDC which is the decreased voltage such that the electric power is flowed toward the essential buses 22L, 22R. Therefore, the essential buses 22L, 22R can be supplied with the electric power from the secondary batteries 13L, 13R, as well as the electric power from the primary AC buses 21L, 21R.

The rectifiers 253L, 253R convert the electric power of 230 VAC from the primary AC buses 21L, 21R into electric power of +/−270 VDC. The DC buses 24L, 24R connected to the rectifiers 253L, 253R, respectively, supply the converted electric power of +/−270 VDC to great power loads such as the hydraulic/air-conditioning motors 161.

The primary power supply relays 281, the secondary power supply relays 282, the starting switch relays 283, the right-left connection relays 284, and the DC power supply switch relays 285, are "relay components" which are configured to suitably perform switching between connection and disconnection of the electric power, in desired locations of the left electric system 20L and the right electric system 20R. Note that these relay components are depicted by symbols of capacitors in FIG. 1.

The primary power supply relays 281 are relay components directly connected to the AC power supplies. The primary power supply relays 281 are in a connected state when the electric power is supplied from the AC power supplies to the primary AC buses 21L, 21R, etc., and are in a disconnected state when the electric power is not supplied from the AC power supplies to the primary AC buses 21L, 21R, etc. The secondary power supply relays 282 are relay components (except for the primary power supply relays 281 and the starting switch relays 283) directly connected to the primary AC buses 21L, 21R. The secondary power supply relays 282 are in a connected state when the electric power is supplied from the AC power supplies to the components via the primary AC buses 21L, 21R, and are in a disconnected state when the electric power is not supplied from the AC power supplies to the components via the primary AC buses 21L, 21R.

The starting switch relays 283 are relay components connected to the AC power stabilizing devices 30L, 30R. In the present embodiment, two starting switch relays 283 are connected to each of the AC power stabilizing devices 30L, 30R. One (first starting switch relay) of the two starting switch relays 283 is interposed between each of the AC power stabilizing devices 30L, 30R and the primary AC bus 21L. The other starting switch relay (second starting switch relay) 283 is interposed between each of the AC power stabilizing devices 30L, 30R and the APU starter/generator 124.

The second starting switch relays 283 are, as described later, in a connected state in the case where the APU starter/generator 124 is activated. This allows the AC power stabilizing devices 30L, 30R to be connected to the APU starter/generator 124 via the paths (starting paths) without via the primary AC buses 21L, 21R. In a case where the AC power is supplied from the AC power generators 14L, 14R (or APU starter/generator 124, RAT generator 171), and others, via the primary AC buses 21L, 21R, the second starting switch relays 283 are in the disconnected state, and the AC power stabilizing devices 30L, 30R are connected to the primary AC buses 21L, 21R via the normal paths (paths including the first starting switch relays 283).

As described above, the right-left connection relays 284 are relay components which enable the electric power to be supplied between the left electric system 20L and the right electric system 20R. The right-left connection relays 284 are in the connected state in the case where the electric power is supplied from one of the electric systems 20L, 20R to the other of the electric systems 20L, 20R, and are in the disconnected state in the case where the electric power is not supplied from one of the electric systems 20L, 20R to the other of the electric systems 20L, 20R. In other words, the right-left connection relays 284 are in the disconnected state under the state in which both of the left and right AC power generators 14L, 14R are operating normally, and are in the connected state under the state in which only one of the left and right AC power generators 14L, 14R is operating normally, the AC power is supplied from the APU starter/generator 124, etc.

The DC power supply switch relays 285 are relay components which allow the DC power supplied from the primary AC buses 21L, 21R via the TRUs 251L, 251R and the DC buses 27L, 27R to be supplied to the essential buses 22L, 22R. For example, the DC power supply switch relays 285 are in a connected state in a case where the electric power is supplied from the primary AC buses 21L, 21R via the TRUs 251L, 251R and the DC buses 27L, 27R and are in a disconnected state in a case where the electric power cannot be supplied from the primary AC buses 21L, 21R to the essential buses 22L, 22R.

The specific configuration of the above described power supply devices, power supply buses, transformer/rectifier components, relay components, etc., are not particularly limited, but power supply devices, power supply buses, rectifiers, transformers, etc., which are known in the field of the aircraft, may be used, except for special cases. In addition, known configurations of the aircraft may be suitably used for the power loads such as the motor controllers and the actuators.

[Basic Configuration of AC Power Stabilizing Device]

Exemplary basic configuration of the AC power stabilizing devices 30L, 30R connected to the electric systems 20L, 20R, respectively, will be described specifically with reference to FIGS. 2 to 4.

Figure 2:
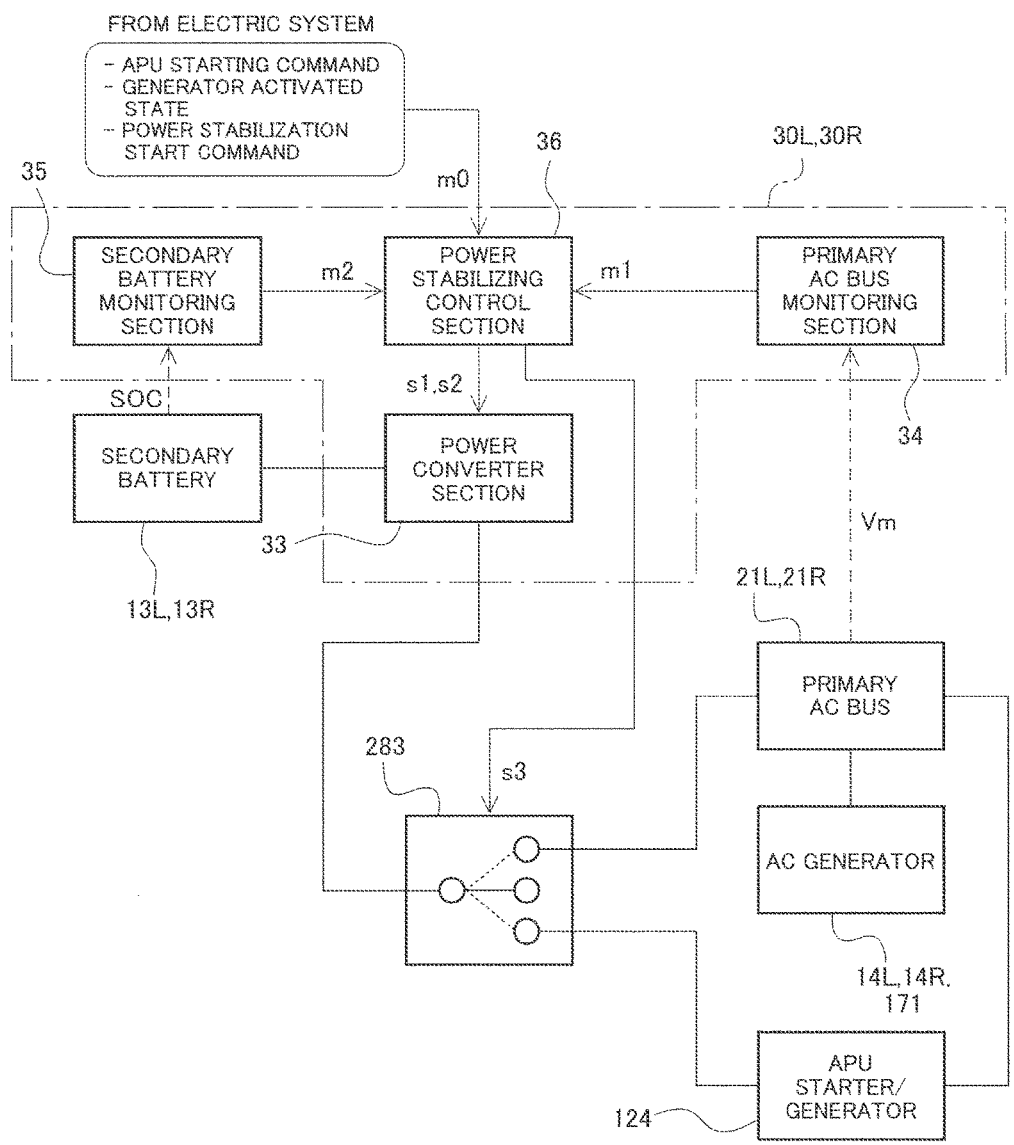
FIG. 2 is a block diagram showing an exemplary schematic configuration of an AC power stabilizing device in the electric system stabilizing system for the aircraft of FIG. 1.

As shown in FIGS. 2 to 4, the AC power stabilizing device 30L or 30R of the present embodiment includes at least a power converter section 33, a primary AC bus monitoring section 34, a secondary battery monitoring section 35, and a power stabilizing control section 36. FIG. 2 is a schematic block diagram showing the overall configuration of the AC power stabilizing device 30L, 30R. FIGS. 3 and 4 are schematic block diagrams showing the configuration of control performed by the power stabilizing control section 36. Therefore, in FIGS. 3 and 4, for the sake of easier explanation, the primary AC bus monitoring section 34 and the secondary battery monitoring section 35 shown in FIG. 2 are omitted.

The power converter section 33 allows conversion between the DC power and the AC power to occur between the secondary battery 13L, 13R which is the DC power supply and the AC power generator 14L, 14R or the APU starter/generator 124. In the present embodiment, the power converter section 33 includes a PWM converter 331 and a boost converter 332.

As shown in FIG. 3, the PWM converter 331 starts the APU starter/generator 124 in the state in which the PWM converter 331 is connected to the APU starter/generator 124 of the APU 12 via the starting path (see FIG. 1) by performing switching of two starting switch relays 283. Therefore, the PWM converter 331 corresponds to the motor controller of the APU starter/generator 124. Based on the output of the PWM converter 331, the primary AC bus 21L, 21R is stabilized. The specific configuration of the PWM converter 331 is not particularly limited. In the present embodiment, as the PWM converter 331, an inverter circuit using, for example, IGBT (Insulated Gate Bipolar Transistor) is used.

As shown in FIGS. 3 and 4, the boost converter 332 is connected to the secondary battery 13L, 13R and boosts the DC power from the secondary battery 13L, 13R to supply the DC power to the PWM converter 331. The specific configuration of the boost converter 332 is not particularly limited. In the present embodiment, for example, a bidirectional chopper circuit using IGBT is used as the boost converter 332. The boost converter 332 may be omitted if it is not necessary to boost the DC power from the secondary battery 13L, 13R.

Although only one starting switch relay 283 is schematically depicted in FIGS. 2 to 4, two starting switch relays 283 are provided in the electric system 20L, 20R. The two starting switch relays 283 are configured to perform switching to connect the power converter section 33 to the APU starter/generator 124 without via the primary AC bus 21L, 21R (starting path), or to connect the power converter section 33 to the AC power supply (AC power generator 14L, 14R, APU starter/generator 124 or RAT generator 171) via the primary AC bus 21L, 21R (normal path) (see FIG. 1 in addition to FIGS. 2 to 4).

As described above, the AC power stabilizing device 30L, 30R is connected to the APU starter/generator 124 via two paths which are the starting path and the normal path. The starting switch relays 283 are provided on these two paths, respectively. In FIG. 2, only the starting switch relay 283 is illustrated. Specifically, the block indicating the APU starter/generator 124 is illustrated as being directly connected to the second starting switch relay 283. To depict the normal path, the first starting switch relay 283 is omitted and the primary AC bus 21L, 21R is connected to the APU starter/generator 124 by means of lines. The block of the AC power generator of FIG. 2 includes the RAT generator 171 as well as the AC power generator 14L, 14R.

In FIGS. 3 and 4, to describe the starting path, the APU starter/generator 124 is schematically represented by a circular block, and AC power supplies (AC power generators 14L, 14R, and the RAT generator 171) other than the APU starter/generator 124, are collectively indicated by one circular clock. Only the starting switch relay 283 corresponding to the starting path is shown, and the starting switch relay 283 corresponding to the normal path is not shown. Since the APU starter/generator 124 is also connected to the AC power stabilizing device 30L, 20R via the normal path as in the case of other AC power supplies. Therefore, regarding the circular block indicating other AC power supplies, reference symbol "124" in parentheses is added to include a case where the APU starter/generator 124 is connected via the normal path.

In the case where the APU 12 is in a deactivated state and it becomes necessary to start the APU 12, as shown in FIG. 3, the power converter section 33 is connected to the APU starter/generator 124 (APU 12) via the starting path by switching of the starting switch relays 283. The power stabilizing control section 36 causes the power converter section 33 to convert the DC power from the secondary battery 13L, 13R into AC power and supply the AC power to the APU starter/generator 124 (APU 12), thereby starting the APU 12.

In a case where the secondary battery 13L, 13R is in a chargeable state and the power converter section 33 is connected via the normal path by switching of the starting switch relays 283, as shown in FIG. 4, the power stabilizing control section 36 causes the power converter section 33 to convert the AC power from the AC power supply (AC power generator 14L, 14R, or the APU starter/generator 124) connected to the primary AC bus 21L, 21R into DC power and supplies the DC power to the secondary battery 13L, 13R, thereby charging the secondary battery 13L, 13R.

As shown in FIG. 4, it is supposed that the power converter section 33 is connected via the normal path by switching of the starting switch relays 283, and at least one of a plurality of electric devices, for example, control surface actuator 15, is connected to the primary AC bus 21L, 21R. It is supposed that a situation occurs in this state, in which the AC power generator 14L, 14R fails, and the AC power is not supplied to the primary AC bus 21L, 21R. In this case, the APU starter/generator 124 starts generating the electric power or the RAT generator 171 starts generating the electric power, thereby supplying the AC power to the primary AC bus 21L, 21R.

However, the AC power supply cannot always start generating the electric power without a delay immediately after the above situation occurs. Because of this, if the above situation occurs, there is a chance that the AC power will not be supplied temporarily (for a specified time period) to the primary AC bus 21L, 21R. To address this, the power stabilizing control section 36 causes the power converter section 33 to convert the DC power from the secondary battery 13L, 13R into the AC power and supply the AC power temporarily (for a specified time period) to power loads (electric devices) which are at least required to enable the aircraft to fly in safety via the primary AC bus 21L, 21R.

As shown in FIG. 2, the primary AC bus monitoring section 34 monitors at least one of a change in the voltage and a change in the frequency of the primary AC bus 21L, 21R, and outputs a measurement voltage value which is a monitoring result (arrow m1 in FIG. 2) to the power stabilizing control section 36. The specific configuration of the primary AC bus monitoring section 34 is not particularly limited, but a known AC power monitoring unit or the like may be suitably used.

As shown in FIG. 2, the secondary battery monitoring section 35 monitors the SOC (state of charge) of the secondary battery 13L, 13R and outputs a result of monitoring (arrow m2 in FIG. 2) to the power stabilizing control section 36. The specific configuration of the secondary battery monitoring section 35 is not particularly limited, but a known SOC detector capable of detecting the SOC of the secondary battery 13L, 13R may be suitably used.

As the SOC detector, an SOC detector is known which uses an integration SOC method which integrates a charging/discharging current, or an instantaneous SOC method which estimates the SOC based on a battery voltage, a battery current, a battery temperature, etc., either of which can be suitably used. In the present embodiment, preferably, a SOC detector configured to make compensation for an accumulated error generated in the integration SOC method by the instantaneous SOC method is used. This makes it possible to suppress the error of SOC from being accumulated even after a long-time use of the SOC detector. Therefore, accurate SOC can be output to the power stabilizing control section 36. As a result, the AC power stabilizing device 30L, 30R can stabilize the electric system 20L, 20R more favorably.

The power stabilizing control section 36 is a controller of the AC power stabilizing device 30L, 30R. As shown in FIGS. 2 to 4, the primary AC bus monitoring section 34 monitors at least one of a voltage and frequency in the primary AC bus 21L, 21R, and controls the power converter section 33 based on a monitoring result. Thus, charging/discharging of the secondary battery 13L, 13R which is the DC power supply, is controlled.

In the present embodiment, as described above, the SOC of the secondary battery 13L, 13R, which is monitored by the secondary battery monitoring section 35, is used for the control. In addition to this, as shown in FIG. 2, information indicating an APU starting command, a generator activated state, a power supply stabilization start command, etc., which are obtained in the electric system 20L, 20R, are output (arrow m0 in FIG. 2) to the power stabilizing control section 36 and used to control the power converter section 33.

In the present embodiment, as described later, in the case where the AC power supply (AC power generator 14L, 14R) is a variable frequency (VF), the voltage in the primary AC bus 21L, 21R is monitored, a first-order lag value of a measurement value of the voltage is determined as a target value in control, and charging/discharging of the DC power supply is controlled based on a difference (deviation) between the target value and the measurement value. In the case where the AC power supply is the constant frequency (CF), the voltage and frequency of the primary AC bus 21L, 21R is monitored, a first-order lag value of a measurement value of the voltage and a first-order lag value of a measurement value of the frequency are determined as target values in control, and charging/discharging of the DC power supply is controlled based on a difference between the target values and the measurement values.

The specific configuration of the power stabilizing control section 36 of the present embodiment is not particularly limited. The power stabilizing control section 36 may be configured as a logic circuit including a known switching element, a known subtractor, a known comparator, etc., to generate the above stated power command signals. Or, the power stabilizing control section 36 may be a functional configuration implemented by the operation of a CPU of a microcontroller which is the power stabilizing control section 36, according to programs stored in a memory of the microcontroller.

[Exemplary Configuration of Power Stabilizing Control Section: VF-Adaptive Type]

Next, an exemplary specific configuration of the power stabilizing control section 36 will be described with reference to FIGS. 5A and 5B.

Figure 5A:
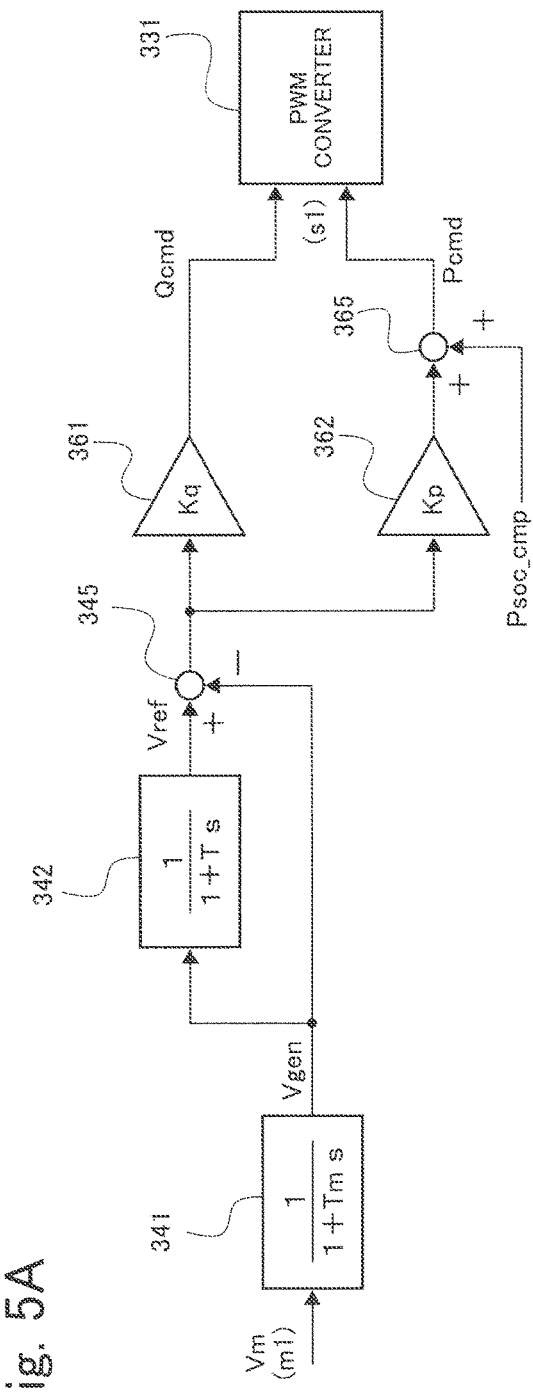
FIG. 5A is a schematic block diagram showing an exemplary charging/discharging control circuit included in a power stabilizing control section in the electric system stabilizing system for the aircraft of FIG. 2.
Figure 5B:
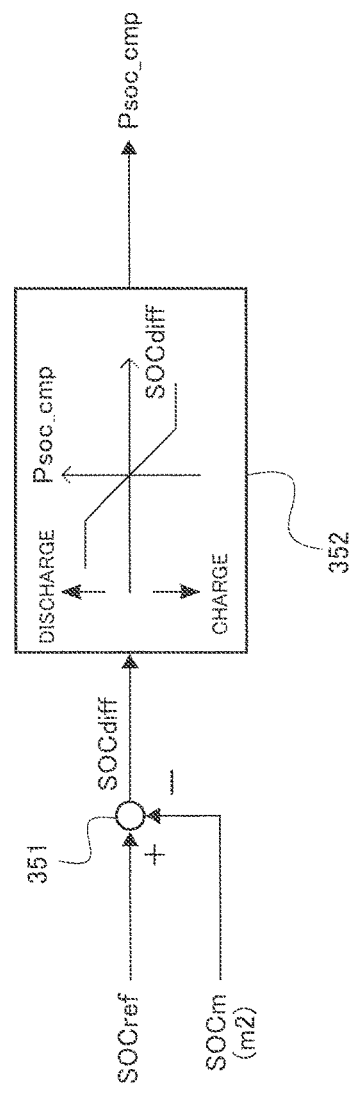
FIG. 5B is a schematic block diagram showing an exemplary SOC compensation circuit included in the power stabilizing control section.

In the case where the AC power generator 14L, 14R is the VF generator, as shown in FIG. 5A, the power stabilizing control section 36 includes "a charging/discharging control circuit" which monitors the voltage in the primary AC bus 21L, 21R (i.e., voltage in the electric system 20L, 20R) and charges/discharges the secondary battery 13L, 13R with active power and/or reactive power based on a result of monitoring. The power stabilizing control section 36 including the charging/discharging control circuit is referred to as "VF-adaptive power stabilizing control section," for easier description.

Specifically, as shown in FIG. 5A, for example, the VF-adaptive power stabilizing control section 36 includes a first lag processor 341, a second lag processor 342, a subtractor 345, a first comparator/controller 361, a second comparator/controller 362, and an adder 365.

As shown in FIG. 2, the primary AC bus monitoring section 34 constituting the AC power stabilizing device 30L, 30R monitors a voltage in the primary AC bus 21L, 21R. As shown in FIG. 5A, the primary AC bus monitoring section 34 outputs a measurement voltage value Vm as a monitoring result m1 to the first lag processor 341 (see FIGS. 3 and 4 in addition to FIG. 5A). The first lag processor 341 indicates a time lag associated with a filter. The first lag processor 341 generates a system voltage value Vgen as the output, and outputs the system voltage value Vgen to the second lag processor 342 and to the subtractor 345. Note that a time constant Tm of the first lag processor 341 is set as a measurement lag time.

The second lag processor 342 performs time lag processing on the system voltage value Vgen to generate a system voltage target value Vref, and outputs the system voltage target value Vref to the subtractor 345. The time constant T of the second lag processor 342 can be set suitably, and set to 10 seconds in the present embodiment. The subtractor 345 subtracts the system voltage value Vgen from the system voltage target value Vref, and outputs the resulting subtraction value (difference, Vref−Vgen) to the first comparator/controller 361 and the second comparator/controller 362.

The first comparator/controller 361 is a controller which generates a power command signal Qcmd used to control charging/discharging of the reactive power. A proportional constant Kq is preset in the first comparator/controller 361. The second comparator/controller 362 is a controller which generates a power command signal Pcmd used to control charging/discharging of the active power. A proportional constant Kq is preset in the second comparator/controller 362. The first comparator/controller 361 multiplies the subtraction value output from the subtractor 345 by the proportional constant Kq, to generate the power command signal Qcmd (=Kq×(Vref−Vgen)), and outputs the power command signal Qcmd to the PWM converter 331 of the power converter section 33 as indicated by arrow s1 in FIG. 3 or FIG. 4.

The second comparator/controller 362 multiplies the subtraction value by the proportional constant Kp, and outputs the resulting multiplication value (Kp×(Vref−Vgen)) to the adder 365. The multiplication value is a base value for an active power command signal Pcmd. In addition, an active power compensation value Psoc_cmp is output to the adder 365, as will be described later. The adder 365 adds the multiplication value (the base value) and the active power compensation value Psoc_cmp to generate the finally power command signal Pcmd (=Kp×(Vref−Vgen)+Psoc_cmp, a final value of the power command signal Pcmd), and outputs the power command signal Pcmd to the power converter section 33 as indicated by arrow s1, s2 in FIG. 3 or FIG. 4. The power converter section 33 controls charging/discharging of the secondary battery 13L, 13R based on the power command signals Qcmd, Pcmd.

More specifically, if a temporary voltage increase is monitored, the system voltage value Vgen becomes greater than the system voltage target value Vref. Because of this, the subtraction value output from the subtractor 345 is a minus value (Vref−Vgen<0), and the active power command signal Pcmd (addition of Psoc_cmp) output from the adder 365 via the second comparator/controller 362 (multiplication of Kp) is also a minus value. Therefore, the power stabilizing control section 36 causes the power converter section 33 to charge the secondary battery 13L, 13R (DC power supply) with the active power, in proportion to a value of the voltage increase based on the power command signal Pcmd.

The reactive power command signal Qcmd output from the first comparator/controller 361 is a minus value because the first comparator/controller 361 multiplies the minus subtraction value by the proportional constant Kq. Therefore, the power stabilizing control section 36 causes the power converter section 33 to output reactive power with a leading power factor in proportion to the value of the voltage increase based on the power command signal Qcmd.

On the other hand, if a temporary voltage decrease (drop) is monitored, the system voltage value Vgen becomes smaller than the system voltage target value Vref. Because of this, the subtraction value output from the subtractor 345 is a plus value (Vref−Vgen>0), and therefore the active power command signal Pcmd output from the adder 365 is also a plus value. Therefore, the power stabilizing control section 36 causes the power converter section 33 to discharge the active power from the secondary battery 13L, 13R (DC power supply) in proportion to a value of the voltage decrease based on the power command signal Pcmd.

The reactive power command signal Qcmd output from the first comparator/controller 361 is a plus value because the first comparator/controller 361 multiplies the plus subtraction value by the proportional constant Kq. Therefore, the power stabilizing control section 36 causes the power converter section 33 to output reactive power with a lagging power factor in proportion to a value of the voltage decrease (drop) based on the power command signal Qcmd.

Thus, in the present embodiment, the first-lag value Vref of the system voltage value Vgen is used as a system voltage target value which is a predetermined voltage value. In this configuration, only when a voltage in the electric system 20L, 20R changes transiently (or temporarily), the power command signal is generated. Therefore, the power stabilizing control section 36 is configured not to generate a power command signal in response to a difference in a voltage generated stationarily in the electric system 20L, 20R. As a result, it is possible to effectively lessen a chance that the secondary battery 13L, 13R will be charged or discharged excessively.

In the present embodiment, if a voltage increase is monitored, the power stabilizing control section 36 may cause the power converter section 33 to charge the DC power supply (secondary battery 13L, 13R) with the active power in proportion to the voltage increase, to output the reactive power with a leading power factor in proportion to the voltage increase, or to charge the DC power supply with the active power and output the reactive power with a leading power factor. This makes it possible to effectively suppress a temporary voltage increase and suppress the electric power from returning to the AC power supply in the electric system 20L, 20R as will be described later.

If a voltage decrease is monitored, the power stabilizing control section 36 may cause the power converter section 33 to discharge the active power from the DC power supply in proportion to the voltage decrease, to output the reactive power with a lagging power factor in proportion to the voltage decrease, or to discharge the active power from the DC power supply and output the reactive power with a lagging power factor. This makes it possible to effectively suppress a temporary voltage decrease from occurring in the electric system 20L, 20R as will be described later.

Although in the present embodiment, the first lag processor 341 and the second lag processor 342 constituting the charging/discharging control circuit are configured to perform the first-lag processing, the present invention is not limited to this. They may be configured to perform another processing such as second-lag processing so long as it performs time-lag processing.

Now, how to generate the active power compensation value Psoc_cmp will be described. The power stabilizing control section 36 of the present embodiment includes an "SOC compensation circuit" which makes compensation for the SOC of the secondary battery 13L, 13R as shown in FIG. 5B, in addition to the charging/discharging control circuit of FIG. 5A. The active power compensation value is generated in the SOC compensation circuit and output to the adder 365. As shown in FIG. 5B, in the present embodiment, this SOC control circuit includes a subtractor 351 and an upper/lower value limiter 352.

As shown in FIG. 2, the secondary battery monitoring section 35 constituting the AC power stabilizing device 30L, 30R monitors the SOC of the secondary battery 13L, 13R. As shown in FIG. 5B, the secondary battery monitoring section 35 outputs a measurement value SOCm of SOC which is a monitoring result m2 to the subtractor 351 (see FIGS. 3 and 4 in addition to FIG. 2). A target value SOCref of SOC is pre-set in the SOC compensation circuit. Therefore, the subtractor 351 compares the target value SOCref to the measurement value SOCm and subtracts the measurement value SOCm from the target value SOCref. The resulting subtraction value SOCdiff (SOCref−SOC) is output to the upper/lower value limiter 352.

The upper/lower value limiter 352 generates the active power compensation value Psoc_cmp based on the subtraction value SOCdiff and outputs the active power compensation value Psoc_cmp to the adder 365 in the charging/discharging control circuit. When the subtraction value SOCdiff is plus, that is, the measurement value SOCm is smaller than the target value SOCref, the upper/lower value limiter 352 generates the active power compensation value Psoc_cmp of a minus sign (Psoc_cmp<0). Thus, compensation is made so that the power command signal Pcmd becomes a command signal for charging the active power. On the other hand, when the subtraction value SOCdiff is minus, that is, the measurement value SOCm is greater than the target value SOCref, the upper/lower value limiter 352 generates the active power compensation value Psoc_cmp of a plus sign (Psoc_cmp>0). Thus, compensation is made so that the power command signal Pcmd becomes a command signal for discharging the active power.

As should be appreciated from the above, in the present embodiment, in the case where the DC power supply is the secondary battery 13L, 13R, its charged state (SOC) is monitored, and compensation is made for a charging/discharging amount of the secondary battery 13L, 13R based on the difference between the measurement value SOCm obtained by the monitoring and the preset predetermined value of SOC (target value SOCref). This makes it possible to effectively lessen a chance that the secondary battery 13L, 13R will be charged or discharged excessively even when the stabilizing operation of the electric system 20L, 20R is performed over a long period of time.

[Exemplary Configuration of Power Stabilizing Control Section: CF-Adaptive Type]

Next, another example of the specific configuration of the power stabilizing control section 36 will be described with reference to FIG. 6.

Figure 6:
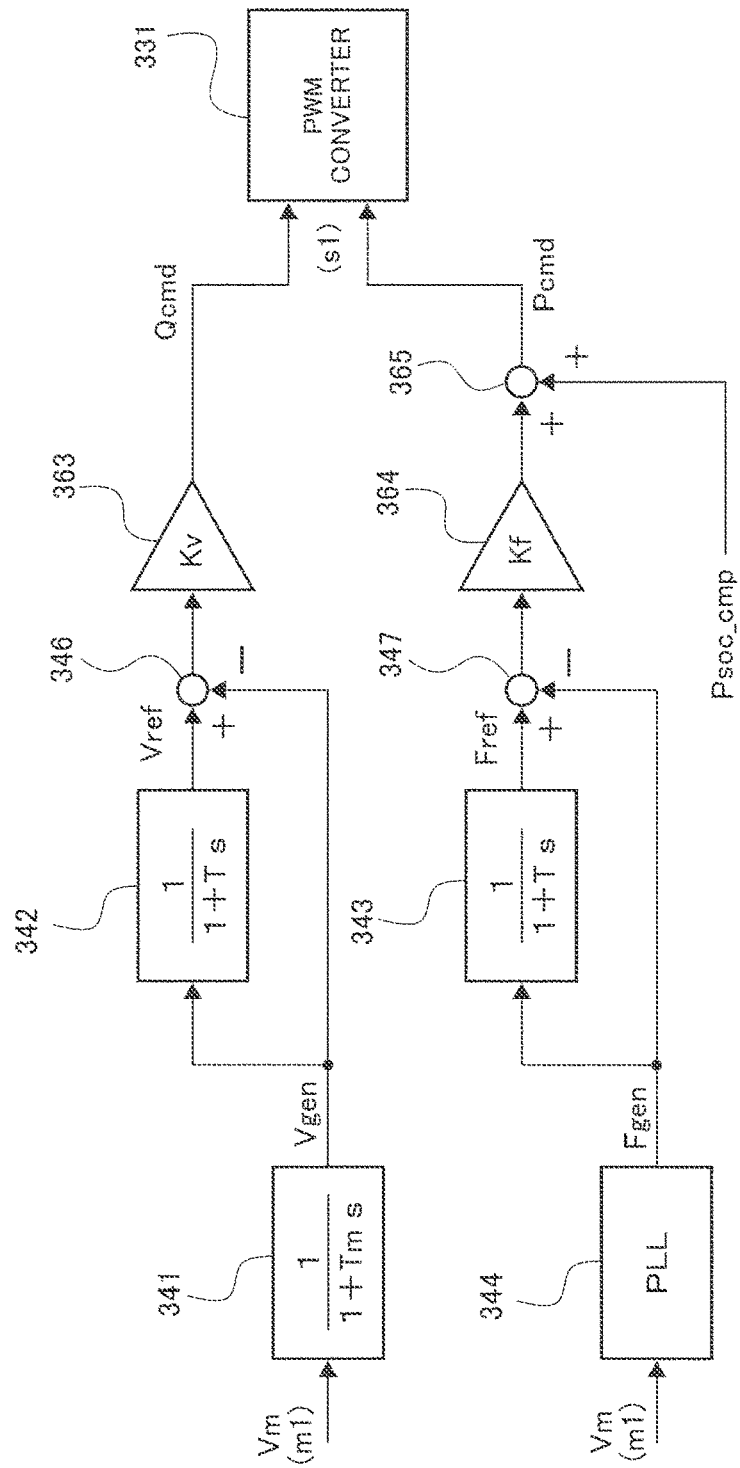
FIG. 6 is a schematic block diagram showing another example of the charging/discharging control circuit included in the power stabilizing control section in the electric system stabilizing system for the aircraft of FIG. 2.

In the case where the AC power generator 14L, 14R is the CF generator, as shown in FIG. 6, the power stabilizing control section 36 includes a charging/discharging control circuit which monitors the voltage and frequency in the primary AC bus 21L, 21R (i.e., voltage and frequency in the electric system 20L, 20R) and charges/discharges active power and/or reactive power based on a result of monitoring. The power stabilizing control section 36 including this charging/discharging control circuit is referred to as "CF-adaptive power stabilizing control section" for easier description.

Specifically, as shown in FIG. 6, for example, the CF-adaptive power stabilizing control section 36 includes a first lag processor 341, a second lag processor 342, a first subtractor 346, a first comparator/controller 363, a PLL processor 344, a third lag processor 343, a second subtractor 347, a second comparator/controller 364, and an adder 365.

The primary AC bus monitoring section 34 which is not shown in FIG. 6, outputs a measurement voltage value Vm as a monitoring result m1, to the first lag processor 341. The first lag processor 341 indicates a time lag associated with a filter. The first lag processor 341 generates a system voltage value Vgen as the output, and outputs the system voltage value Vgen to the second lag processor 342 and to the first subtractor 346. The second lag processor 342 performs time lag processing on the system voltage value Vgen to generate a system voltage target value Vref, and outputs the system voltage target value Vref to the first subtractor 346. The first subtractor 346 subtracts the system voltage value Vgen from the system voltage target value Vref, and outputs the resulting subtraction value (difference, Vref−Vgen) to the first comparator/controller 363.

The first comparator/controller 363 is a comparator/controller which generates a power command signal Qcmd used to control charging/discharging of the reactive power. A proportional coefficient Kv is pre-set in the first comparator/controller 363. The first comparator/controller 363 multiplies the subtraction value output from the first subtractor 346 by the proportional constant Kv, to generate a power command signal Qcmd (=Kv×(Vref−Vgen)), and outputs the power command signal Qcmd to the PWM converter 331 of the power converter section 33 as indicated by arrow s1, s2 in FIG. 3 or FIG. 4. The power converter section 33 controls charging/discharging of the secondary battery 13L, 13R based on the power command signals Qcmd, and power command signals Pcmd described later.

More specifically, if a temporary voltage increase is monitored, the system voltage value Vgen becomes greater than the system voltage target value Vref. Because of this, as in the case of the VF-adaptive power stabilizing control section, the subtraction value output from the first subtractor 346 is a minus value, and the reactive power command signal Qcmd output from the first comparator/controller 363 is a minus value. Therefore, the power stabilizing control section 36 causes the power converter section 33 to output reactive power with a leading power factor, in proportion to a value of the voltage increase based on the power command signal Qcmd.

On the other hand, if a temporary voltage decrease (drop) is monitored, the system voltage value Vgen becomes smaller than the system voltage target value Vref. Because of this, as in the case of the VF-adaptive power stabilizing control section 36, the reactive power command signal Qcmd output from the first comparator/controller 363 is a plus value. Therefore, the power stabilizing control section 36 causes the power converter section 33 to output reactive power with a lagging power factor in proportion to a value of the voltage increase based on the power command signal Qcmd.

The primary AC bus monitoring section 34 which is not shown in FIG. 6 outputs the measurement voltage value Vm to the PLL processor 344. The PLL processor 344 performs phase locked loop processing on the measurement voltage value Vm to generate the system frequency Fgen in the electric system 20L, 20R, and outputs the system frequency Fgen to the third lag processor 343. The third lag processor 343 is identical in configuration to the second lag processor 342. The third lag processor 343 performs time lag processing on the system frequency Fgen to generate a system frequency target value Fref and outputs the system frequency target value Fref to the second subtractor 347. The second subtractor 347 subtracts the system frequency Fgen from the system frequency target value Fref and outputs the resulting subtraction value (difference, Fef−Fgen) to the second comparator/controller 364.

The second comparator/controller 364 is a comparator/controller which generates the power command signal Pcmd used to control charging/discharging of the active power. A proportional constant Kf is preset in the second comparator/controller 364. The second comparator/controller 364 multiplies the subtraction value by the proportional constant Kf, and outputs the resulting multiplication value (=Kf×(Fref−Fgen)) to the adder 365. The multiplication value is a base value for the active power command signal Pcmd. As described above, the active power compensation value Psoc_cmp is also output from the SOC compensation circuit (see FIG. 5B) to the adder 365. The adder 365 adds the multiplication value (the base value) to the active power compensation value Psoc_cmp, to generate the finally power command signal Pcmd (=Kf×(Fref−Fgen)+Psoc_cmp, a final value of the power command signal Pcmd), and outputs the power command signal Pcmd to the power converter section 33 as indicated by arrow s1, s2 in FIG. 3 or 4. The power converter section 33 controls charging/discharging of the secondary battery 13L, 13R based on the power command signals Qcmd, and power command signals Pcmd described above.

More specifically, if a temporary frequency increase is monitored, the system frequency Fgen becomes greater than the system frequency target value Fref. Because of this, the subtraction value output from the subtractor 345 is a minus value (Fref−Freg<0). Therefore, the active power command signal Pcmd output (addition of Psoc_cmp) from the adder 365 via the second comparator/controller 364 (multiplication of Kf) is also a minus value. Therefore, the power stabilizing control section 36 causes the power converter section 33 to charge the secondary battery 13L, 13R (DC power supply) with the active power in proportion to the value of the frequency increase based on the power command signal Pcmd.

On the other hand, if a temporary frequency decrease is monitored, the system frequency Fgen becomes smaller than the system frequency target value Fref. Because of this, the subtraction value output from the second subtractor 347 is a plus value (Fref−Freg>0). Therefore, the active power command signal Pcmd output from the adder 365 is also a plus value. Therefore, the power stabilizing control section 36 causes the power converter section 33 to discharge the active power from the secondary battery 13L, 13R (DC power supply) in proportion to the value of the frequency decrease based on the power command signal Pcmd.

As should be appreciated from above, in the CF-adaptive configuration, the frequency of the AC power is constant, and therefore, the power stabilizing control section 36 uses the first-order lag value Vref of the system voltage value Vgen as the target value of the voltage, as in the case of the VF-adaptive configuration, and uses the first-order lag value Fref of the system frequency Fgen as the target value of the frequency.

Therefore, the power command signal(s) is/are generated only when the change in the voltage and/or the change in the frequency in the electric system 20L, 20R is transient (or temporary). Therefore, the power stabilizing control section 36 is configured not to generate the power command signal in response to a difference in the voltage or frequency generated stationarily in the electric system 20L, 20R. As a result, it is possible to effectively lessen a chance that the secondary battery 13L, 13R will be charged or discharged excessively.

Moreover, in the present embodiment, if a frequency increase is monitored, the power stabilizing control section 36 causes the power converter section 33 to charge the DC power supply (secondary battery 13L, 13R) with the active power in proportion to the frequency increase, while if a voltage increase is monitored, the power stabilizing control section 36 causes the power converter section 33 to output the reactive power with a leading power factor in proportion to the voltage increase. This makes it possible to effectively suppress a voltage increase due to temporary regenerative power generated in the electric system 20L, 20R, as will be described later.

On the other hand, if the frequency decrease is monitored, the power stabilizing control section 36 causes the power converter section 33 to discharge the active power from the DC power supply in proportion to the frequency decrease, while if the voltage decrease is monitored, the power stabilizing control section 36 causes the power converter section 33 to output reactive power with a lagging power factor in proportion to the voltage decrease. This makes it possible to effectively suppress a temporary voltage decrease generated in the electric system 20L, 20R, as will be described later.

[Stabilization of Electric System]

Next, exemplary stabilization of the electric system 20L, 20R by the AC power stabilizing device 30L, 30R having the above configuration will be described with reference to FIGS. 7, 8A, 8B, 9, 10 and 11, in addition to FIGS. 2 to 4. For easier explanation, in FIGS. 8A, 8B, 9, 10 and 11, the power loads in the electrically driven system (e.g., hydraulic pump in the hydraulic system, or air-conditioning compressor in the breed air system), which are other than the control surface actuator 15, are indicated by "block of reference symbol 16."

Figure 7:
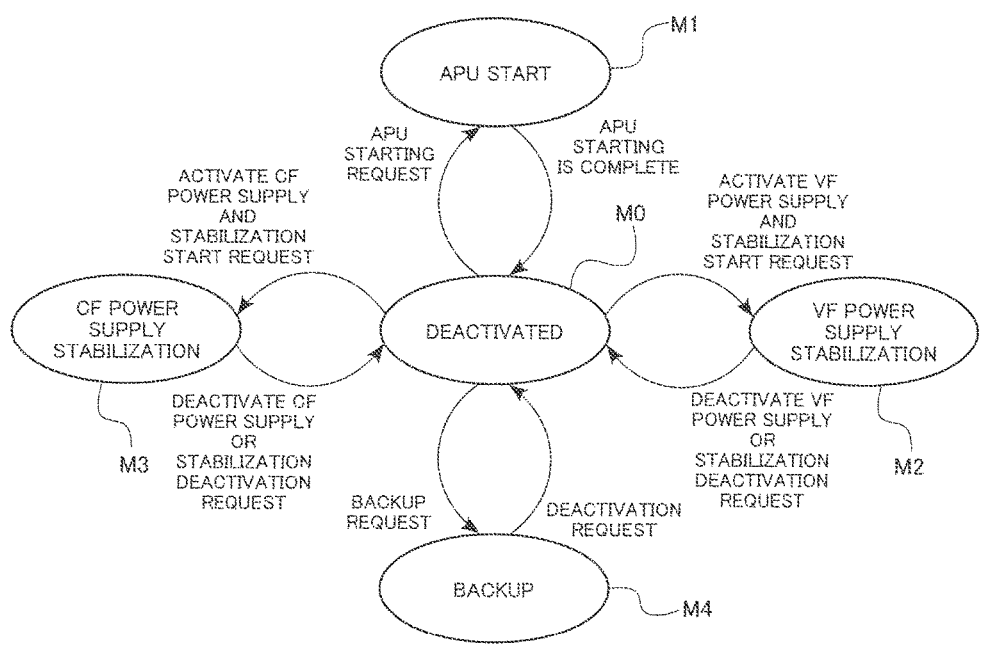
FIG. 7 is a schematic view showing an exemplary state transition under control performed by the AC power stabilizing device in the electric system stabilizing system for the aircraft of FIG. 1.

As shown in FIG. 7, the stabilizing system of the present embodiment is configured to transition among five states including a deactivated state under control performed by the AC power stabilizing device 30L, 30R. In FIG. 7, a state M0 at the center is the deactivated state. If starting of the APU 12 is requested, the AC power stabilizing device 30L, 30R starts the APU 12, and therefore the stabilizing system transitions to a state M1 at an upper side in FIG. 7: an APU starting state. When starting of the APU 12 is completed, the stabilizing system returns to the state M0: deactivated state. If backup is requested, the stabilizing system transitions to a state M4 at a lower side in FIG. 7: backup state, while if deactivation of the backup is requested, the stabilizing system returns to the state M0: deactivated state.

When the VF generator included in the AC power generator 14L, 14R is activated and starting of stabilization of the electric system 20L, 20R is requested, the stabilizing system transitions to a state M2 at a right side in FIG. 7: a VF power supply stabilization state. When the VF AC power generator 14L, 14R is deactivated or deactivation of stabilization is requested, the stabilizing system returns to the state M0: deactivated state. In the same manner, when start of stabilization of the electric system 20L, 20R is requested in a state in which the APU starter/generator 124 is supplying electric power as the generator, or the CF generator included in the AC power generator 14L, 14R is supplying the electric power, the stabilizing system transitions to a state M3 at a left side in FIG. 7: CF power stabilization state. If the AC power generator 14L, 14R or the APU starter/generator 124 are deactivated, or deactivation of stabilization is requested, the stabilizing system returns to the state M0: deactivated state.

Among the AC power supplies, the RAT generator 171 is categorized into the VF generator. Therefore, when start of stabilization of the electric system 20L, 20R is requested in a state in which the RAT generator 171 is supplying the electric power as the generator, the stabilizing system transitions to the state M2: VF power stabilization state at the right side in FIG. 7. When the RAT generator 171 is deactivated or deactivation of the stabilization is requested, the stabilizing system returns to the state M0: deactivated state.

Figure 8A:
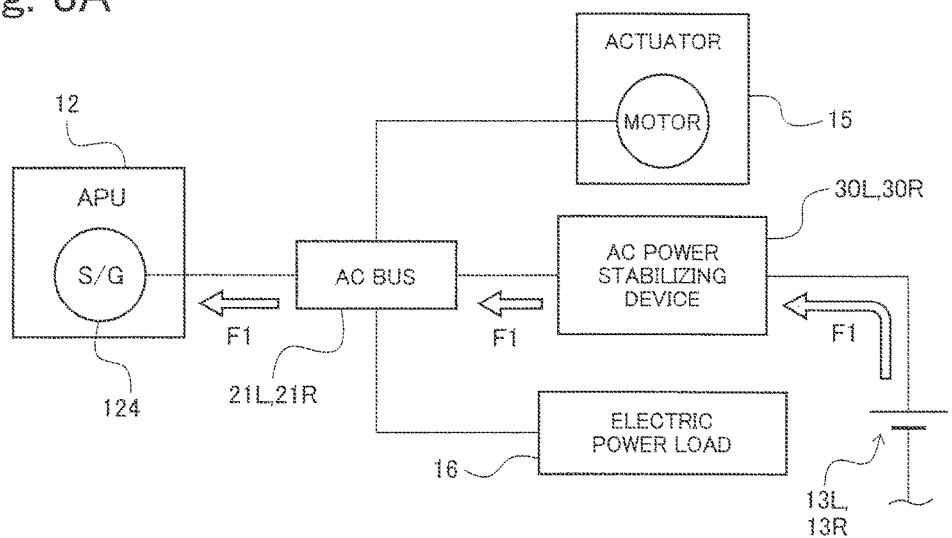
FIG. 8A is a schematic block diagram showing a state in which electric power is supplied from the secondary battery (DC power supply) when an auxiliary power unit is started, in the electric system stabilizing system for the aircraft of FIG. 1.

Next, how to stabilize the electric system 20L, 20R will be described with reference to the above mentioned state transition. Initially, as shown in FIGS. 3 and 8A, during the starting of the APU starter/generator 124 of the APU 12, the stabilizing system transitions from the state M0 in FIG. 7 to the state M1 in FIG. 7, and the AC power stabilizing device 30L, 30R causes the secondary battery 13L, 13R to be discharged as indicated by block arrow F1. At this time, the power converter section 33 is connected to the APU starter/generator 124 via the starting path rather than the normal path by switching of the starting switch relays 283. The power stabilizing control section 36 causes the power converter section 33 to convert the DC power from the secondary battery 13L, 13R into AC power supplied to the primary AC bus 21L, 21R.

Specifically, the power stabilizing control section 36 generates a power command signal used to discharge the electric power from the secondary battery 13L, 13R toward the APU starter/generator 124, and output the power command signal as an input to the PWM converter 331 and the boost converter 332 constituting the power converter section 33. In FIG. 3 (and FIG. 4), the power command signal input to the PWM converter 331 is indicated by thin-line arrow s1, while the power command signal input to the boost converter 332 is indicated by thin-line arrow s2. In the present embodiment, the power command signal is a gate drive signal for causing a plurality of switching elements (e.g., power semiconductor elements) constituting the PWM converter 331 or the boost converter 332 to be turned ON/OFF.

Receiving the gate drive signal as the input, the switching elements in the PWM converter 331 or the boost converter 332 are switched, thereby discharging the electric power from the secondary battery 13L, 13R as indicated by block arrow F1. As a result, the electric power is supplied from the secondary battery 13L, 13R to the APU starter/generator 124, thereby enabling the APU starter/generator 124 to start (be activated). Upon the APU starter/generator 124 starting, the left engine 11L and the right engine 11R start by the APU 12, so that the AC power generators 14L, 14R provided in the engines 11L, 11R start generating electric power.

Figure 8B:
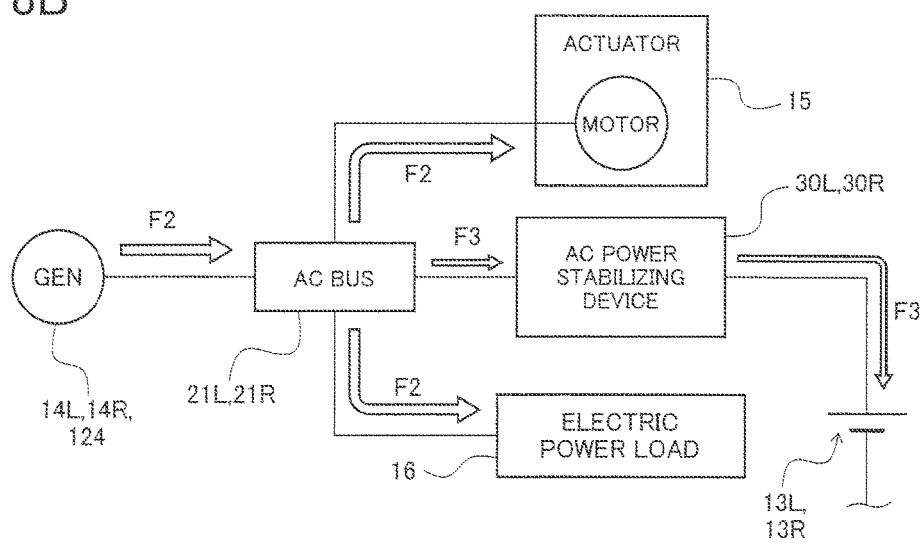
FIG. 8B is a schematic block diagram showing a state in which electric power is supplied from the AC power generator (AC power supply) in a normal state, in the electric system stabilizing system for the aircraft of FIG. 1.

Upon the APU starter/generator 124 starting, the AC power is supplied from the APU starter/generator 124 to the primary AC bus 21L, 21R. At this time, the stabilizing system returns from the state M1 to the state M0 and then transitions to the state M3 in response to a stabilization start request. In this state, the engine 11L, 11R starts. Therefore, as shown in FIG. 8B, a supply source of the AC power to the primary AC bus 21L, 21R switches from the APU starter/generator 124 to the AC power generator 14L, 14R. In switching of the AC power supply, the stabilizing system goes through the state M0, and then transitions to the state M2 or to the state M3 depending on the configuration (VF or CF) of the AC power generator 14L, 14R.

Concurrently with this, the power converter section 33 switches the connecting path from the starting path to the normal path. Then, the power stabilizing control section 36 causes the power converter section 33 to convert the AC power from the primary AC bus 21L, 21R into the DC power supplied to the secondary battery 13L, 13R. Thereby, as indicated by block arrow F3 in FIGS. 4 and 8, the electric power from the AC power generator 14L, 14R is supplied to the secondary battery 13L, 13R to charge the secondary battery 13L, 13R.

Specifically, as indicated by the thin-line arrow m1 of FIG. 4, the primary AC bus monitoring section 34 (not shown in FIG. 4) monitors the voltage and frequency in the primary AC bus 21L, 21R (e.g., voltage and frequency in electric system 20L, 20R). The power stabilizing control section 36 generates the power command signals s1, s2 based on the monitoring result, and outputs the power command signals s1, s2 to the PWM converter 331 and to the boost converter 332. In response to the power command signals s1, s2, the switching elements of the PWM converter 331 and the switching elements of the boost converter 332 are switched, thereby charging the secondary battery 13L, 13R as indicated by block arrow F3.

The AC power supplied from the AC power generator 14L, 14R is supplied mainly to the control surface actuator 15 and another power load 16. Therefore, in FIG. 8B, block arrows F2 indicating electric power supply to these power loads are represented by relatively bold lines, while block arrows F3 indicating electric power supply to the secondary battery 13L, 13R for charging are represented by relatively thin lines. The state shown in FIG. 8B is a state in which the electric power is supplied from the AC power supplies through the normal path. The AC power supplies at this time include the APU starter/generator 124 as well as the AC power generator 14L, 14R.

Figure 9:
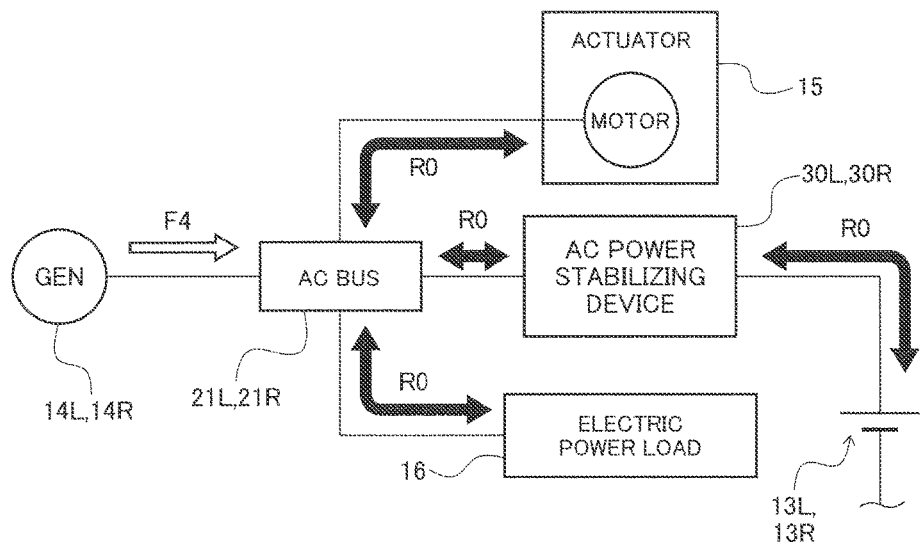
FIG. 9 is a schematic block diagram showing a state in which regenerative power generated in an actuator is absorbed and deficient electric power due to a voltage decrease (drop) is made up for, in the electric system stabilizing system for the aircraft of FIG. 1.

If a voltage increase due to the regenerative power or the like occurs or a voltage decrease (drop) occurs due to an increase in power loads in the above state in which the electric power is supplied normally, as shown in FIG. 9, the AC power stabilizing device 30L, 30R performs stabilization control in such a manner that, for example, the secondary battery 13L, 13R absorbs the voltage increase or supplies electric power to make up for deficient electric power due to the voltage decrease. In FIG. 9, the regenerative power and make-up electric power are collectively indicated by bidirectional block arrow R0.

Specifically, for example, as indicated by the thin-line arrow m1 in FIG. 4, if it is detected that the regenerative power occurs (voltage increases, frequency increases, etc.) in the primary AC bus 21L, 21R whose power state is monitored by the primary AC bus monitoring section 34 (not shown in FIG. 4), the power stabilizing control section 36 generates the power command signals s1, s2 and outputs the power command signals s1, s2 to the power converter section 33, so that the electric power is supplied from the primary AC bus 21L, 21R to the secondary battery 13L, 13R. Note that the power state to be monitored may be at least a voltage but may be, for example, a frequency together with the voltage.

In the PWM converter 331 and the boost converter 332 constituting the power converter section 33, the switching elements are switched based on the power command signals, so that the regenerative power which has flowed into the primary AC bus 21L, 21R flows toward the secondary battery 13L, 13R as indicated by block arrow R0-3 (the same direction as that of the block arrow F3) in FIG. 4. Since the secondary battery 13L, 13R is configured to have a higher voltage sufficient to absorb the regenerative power, the generated regenerative power can be charged into and thereby favorably absorbed into the secondary battery 13L, 13R.

As described above, when the voltage increases, the power stabilizing control section 36 causes the power converter section 33 to output the reactive power with a leading power factor in proportion to a voltage increase. This control also can suppress the voltage increase.

In the same manner, as indicated by the thin-line arrow m1 of FIG. 4, if a significant voltage decrease (voltage decrease, frequency decrease, etc.) is detected in the primary AC bus 21L, 21R whose power state is monitored by the primary AC bus monitoring section 34 (not shown in FIG. 4), the power stabilizing control section 36 generates the power command signals s1, s2 and outputs the power command signals s1, s2 to the power converter section 33 so that the electric power is supplied from the secondary battery 13L, 13R to the primary AC bus 21L, 21R.

In the PWM converter 331 and the boost converter 332 in the power converter section 33, the switching elements are switched based on the power command signals and the DC power from the secondary battery 13L, 13R flows toward the primary AC bus 21L, 21R as indicated by the block arrow R0-4 in FIG. 4. As a result, the secondary battery 13L, 13R auxiliarily supplies the electric power to assist the AC power generator 14L, 14R, which can lessen an overloaded state of the AC power generator 14L, 14R. In other words, the electric power supplied from the secondary battery 13L, 13R can make up for a significant voltage decrease due to the overloaded state.

As described above, if the voltage decrease is monitored, the power stabilizing control section 36 causes the power converter section 33 to output the reactive power with a lagging power factor in proportion to the voltage decrease. This control also can suppress the voltage decrease.

As should be appreciated from the above, in accordance with the present embodiment, the AC power stabilizing device 30L, 30R monitors the voltage and frequency in the primary AC bus 21L, 21R and controls charging/discharging of the DC power supply. Therefore, the significant regenerative power can be absorbed by the DC power supply via the primary AC bus 21L, 21R, or deficiency of the electric power due to the temporary voltage decrease can be made up for by supplying the electric power from the DC power supply. As a result, unlike the conventional configuration, for example, it is not necessary to provide the resistor into the controller of the control surface actuator 15 to consume the regenerative power by heat generation, or it is not necessary to increase a power generation capacity of the AC power supplies adaptively to a maximum load. Thus, the electric system stabilizing system for the aircraft of the present invention is capable of favorably stabilizing the electric system 20L, 20R while avoiding a weight increase.

Figure 10:
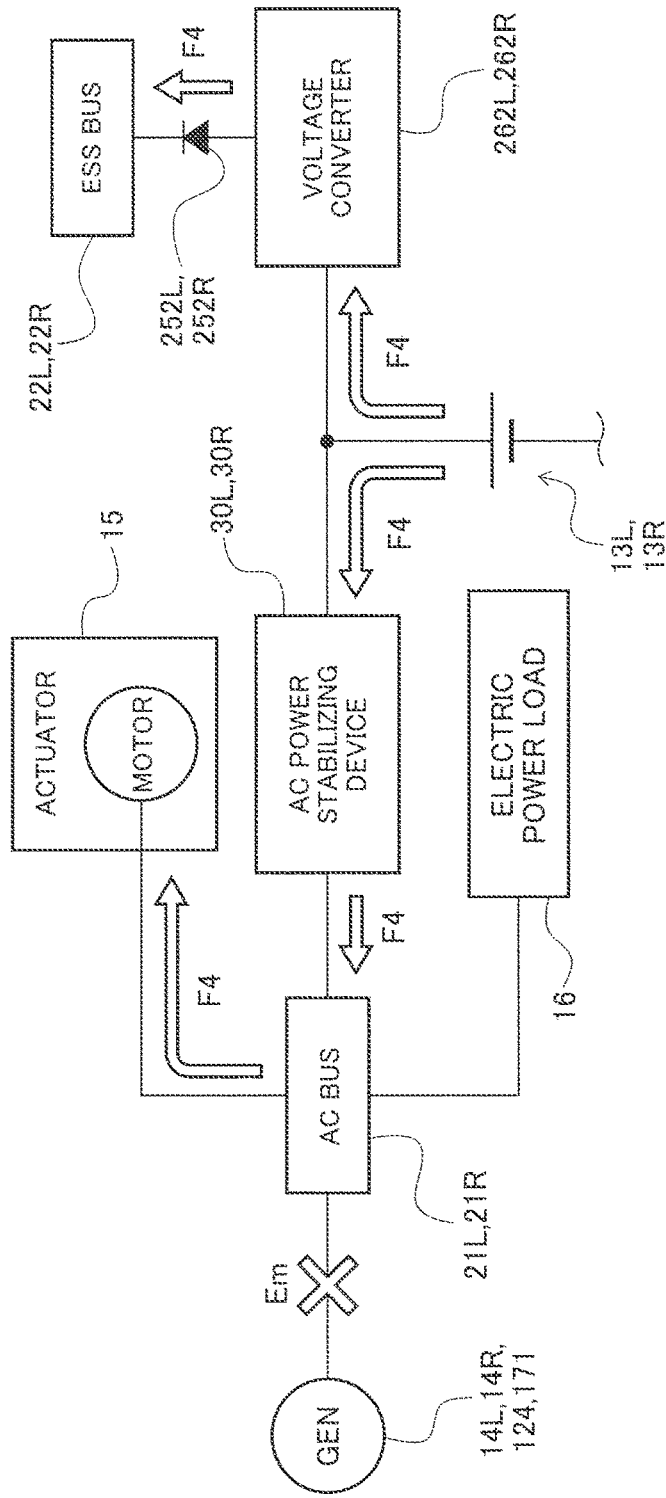
FIG. 10 is a schematic block diagram showing a state in which electric power is supplied from the secondary battery (DC power supply) to an actuator and to an essential bus in a case where a situation in which no electric power is not supplied from the AC power generator (AC power supply) occurs, in the electric system stabilizing system for the aircraft of FIG. 1.

As shown in FIG. 10, even when some abnormality (X arrow Em in FIG. 10) occurs in the AC power generator 14L, 14R and thereby the electric power is not supplied to the primary AC bus 21L, 21R, the power stabilizing control section 36 in the AC power stabilizing device 30L, 30R causes the power converter section 33 to convert the DC power from the secondary battery 13L, 13R into AC power supplied to the primary AC bus 21L, 21R. This state corresponds to the state M4 in FIG. 7: backup state.

At least one of the electric devices is connected to the primary AC bus 21L, 21R. When the AC power is not supplied from the AC power generator 14L, 14R to this electric device via the primary AC bus 21L, 21R, the power stabilizing control section 36 causes the power converter section 33 to convert the DC power from the secondary battery 13L, 13R into AC power so that the AC power can be supplied to the electric device temporarily (for a specified time) via the primary AC bus 21L, 21R. Thereby, as indicated by the block arrow R4 in FIG. 10, the AC power obtained from the DC power supplied from the secondary battery 13L, 13R is supplied to the primary AC bus 21L, 21R.

If a situation occurs, in which the electric power is not supplied from the AC power generator 14L, 14R, the APU 12 or the RAT 17 is activated and thereby the APU starter/generator 124 or the RAT generator 171 is activated, to start generating electric power. A certain activation time (e.g., about 5 seconds) is required to activate the auxiliary generator. If the electric power is not supplied for such a very short time, the operation of the aircraft may be negatively affected. Therefore, the power stabilizing control section 36 causes the power converter section 33 to supply the AC power based on the DC power from the secondary battery 13L, 13R, thereby enabling the control surface actuator 15 and the like to operate.

Specifically, if a certain abnormality, for example, occurrence of simultaneous stopping of the AC power generators 14L, 14R in the state in which the AC power is supplied as shown in FIG. 4, the power stabilizing control section 36 generates the power command signals s1, s2 and outputs the power command signals s1, s2 to the power converter section 33 so that the electric power is supplied from the secondary battery 13L, 13R to the primary AC bus 21L, 21R.

In the PWM converter 331 and the boost converter 332 in the power converter section 33, the switching elements are switched based on the power command signals, and the DC power from the secondary battery 13L, 13R flows toward the primary AC bus 21L, 21R as indicated by the block arrow F4 in FIG. 4 (the same direction as that of the block arrow R0-4).

Important power loads which are at least required to enable the aircraft to fly in safety, are connected to the essential bus 22L, 22R. In the present embodiment, during a period of time which passes before the auxiliary generator is activated after the simultaneous stopping of the AC power generators 14L, 14R, or the like occurs, as indicated by the block arrow F4 in FIG. 10, the DC power from the secondary battery 13L, 13R can be supplied to the essential bus 22L, 22R via the voltage converter 262L, 262R, and the rectifier element 252L, 252R.

The essential bus 22L, 22R is supplied with the DC power obtained by converting in the transformer/rectifier 251L, 251R, the AC power supplied from the AC power generator 14L, 14R, via the primary AC bus 21L, 21R. In addition to this, the DC power from the secondary battery 13L, 13R in a higher voltage state is decreased in voltage by the voltage converter 262L, 262R, and always supplied to the essential bus 22L, 22R via the rectifier elements 252L, 252R.

Therefore, in the case where electric power supply from the AC power generator 14L, 14R stops in emergencies, that is, the AC power is not supplied from the AC power generator 14L, 14R to the essential bus 22L, 22R via the primary AC bus 21L, 21R, the electric power can be supplied from the secondary battery 13L, 13R continuously. Therefore, without instantaneous cut-off due to the switching of the relay components, the electric power can be supplied for make-up, which makes it possible to avoid an unforeseen stop of the important control systems.

Figure 11:
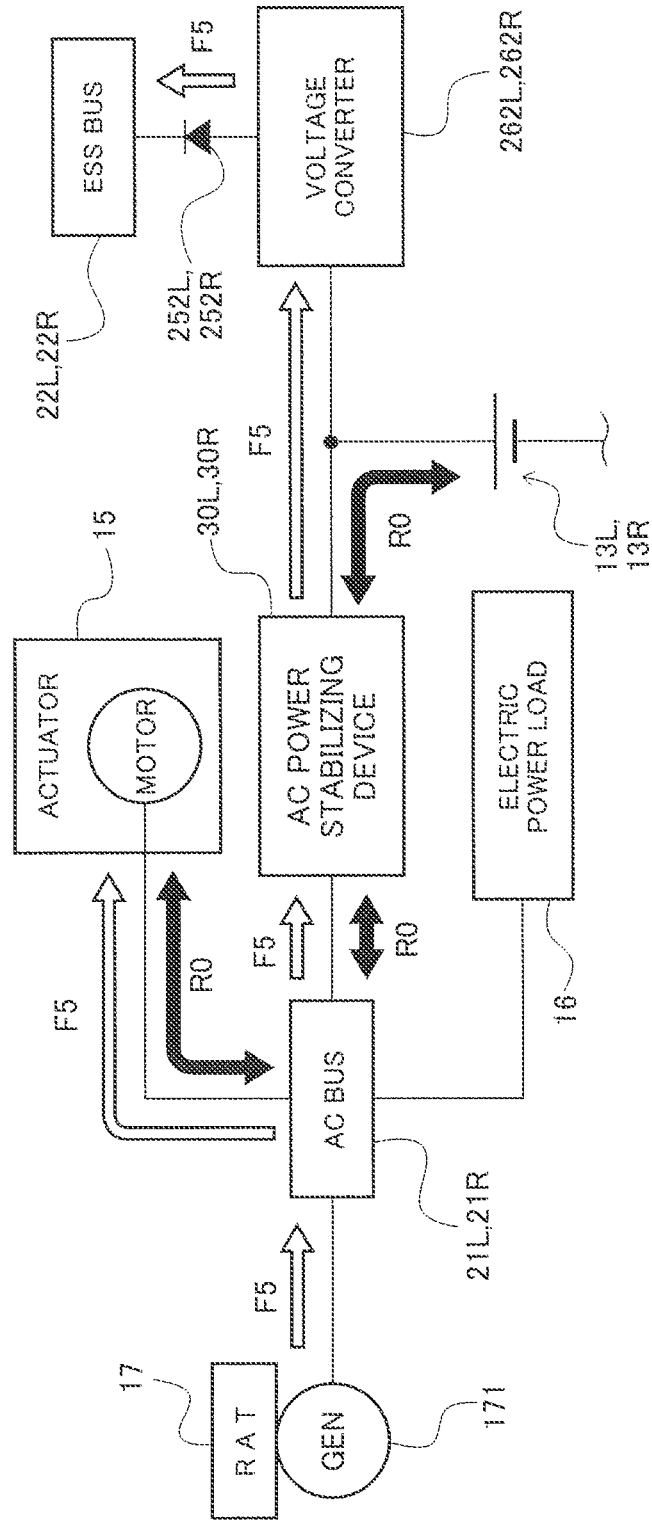
FIG. 11 is a schematic block diagram showing a state in which electric power is supplied from a ram air turbine generator to the actuator and to the essential bus, in the electric system stabilizing system for the aircraft of FIG. 1.

In a case where the AC power generators 14L, 14R mounted to the engines 11L, 11R stop simultaneously, or the engines 11L, 11R stop simultaneously, during the flight of the aircraft, the RAT 17 is deployed outside the aircraft, and the RAT generator 171 of the RAT 17 is activated as schematically shown in FIG. 11. As described above, the RAT generator 171 is able to supply the electric power to the power loads which are essential (requisite) for the aircraft to fly in safety. In FIG. 11, the electric power supplied from the RAT generator 171 is indicated by the block arrow F5.

The power loads which are essential for the aircraft to fly in safety include the control surface actuator 15 and the electric devices connected to the essential buses 22L, 22R. Among these components, the control surface actuator 15 is a power load (electric device) which transiently requires a great load amount. By comparison, the RAT generator 171 is an emergency power supply device, and therefore has a smaller power generation capacity than the AC power generator 14L, 14R, etc. For this reason, in the electric system 20L, 20R, in the case of using only the RAT generator 171 as the AC power supply, a great voltage change with respect to a temporary electric power change tends to occur, as compared to the case of using another AC power supplies.

As a solution to the above, in the present embodiment, as indicated by the bidirectional block arrow R0 in FIG. 11, the AC power stabilizing device 30L, 30R performs stabilization control in such a manner that the secondary battery 13L, 13R absorbs the voltage increase or supplies the electric power to make up for the deficient electric power due to the voltage decrease. Therefore, in the case where the RAT generator 171 is the AC power supply, the stabilizing system of the present embodiment can stabilize the electric system 20L, 20R more effectively.

Specifically, as indicated by the block arrow F5 in FIG. 11, the electric power is supplied from the RAT generator 171 to the control surface actuator 15 via the primary AC buses 21L, 21R. Even when a temporary power load increase occurs or regenerative power is generated, in association with the control surface actuator 15, the stabilization control performed by the AC power stabilizing device 30L, 30R can suppress such a voltage change (or frequency change).

Furthermore, the power stabilizing control section 36 in the AC power stabilizing device 30L, 30R causes the power converter section 33, to convert the AC power of the RAT generator 171 into the DC power. Therefore, as indicated by the arrow F5 in FIG. 11, this DC power can be supplied to the essential bus 22L, 22R. Therefore, in the case of using the RAT generator 171 as the AC power supply, the AC power stabilizing device 30L, 30R can not only stabilize the electric system 20L, 20R but also serve as the power converter used to supply the DC power to the essential bus 22L, 22R.

In addition, the electric system stabilizing system for the aircraft of the present embodiment has an advantage that the configuration can be simplified as compared to a conventional general electric system. Specifically, as shown in FIG. 14, conventional electric system 920L, 920R fundamentally has the same configuration as that of the electric system 20L, 20R of the present embodiment of FIG. 1. A secondary battery 913 is connected to a secondary AC bus 23L in the left electric system 920L via a secondary battery charger 924. The secondary battery 913 is connected to the essential bus 22L, 22R. A charging switch relay 286 is interposed between the secondary battery charger 924 and the secondary battery 913, while a battery power supply switch relay 287 is interposed between the secondary battery 913 and the essential bus 22L, 22R.

An APU starting secondary battery 922 is connected to the secondary AC bus 23R in the right electric system 920R via an APU starting secondary battery charger 925. An APU starting controller 921 (motor controller) is connected to the APU starting secondary battery 922 via a booster 923. The APU starting controller 921 is connected to the APU (APU starter/generator 124) along with the primary AC bus 21L, 21R. A charging switch relay 286 is interposed between the APU starting secondary battery charger 925 and the APU starting secondary battery 922.

Furthermore, a backup transformer/rectifier 926 is connected to the backup bus 29 connected to the RAT generator 171. The backup transformer/rectifier 926 is a transformer/rectifier component which converts the AC power in the RAT generator 171 into the DC power and supplies the DC power to the essential bus 22L, 22R. The backup transformer/rectifier 926 is connected to the essential bus 22L, 22R via the DC power supply switch relay 285.

In this configuration, as the DC power supply, two batteries, i.e., the secondary battery 913 which is a backup power supply of the essential bus 22L, 22R, and the APU starting secondary battery 922 provided exclusively for starting of the APU 12, are required. In addition, these secondary batteries 913, 922 are not connected to the AC power stabilizing device 30L, 30R of the present embodiment. Therefore, it is required that the secondary battery charger 924 and the APU starting secondary battery charger 925 be connected for the purpose of charging and the charging switch relays 286 be interposed between the chargers 924, 925 and the secondary batteries 913, 922.

Although in the present embodiment, the AC power stabilizing device 30L, 30R can be used as the controller for controlling the APU 12 during starting, it is necessary to separately provide the APU starting controller 921 in the conventional aircraft. In addition, since the rated voltage of the APU starting secondary battery 922 is 24 VDC, it is necessary to boost the electric power by using the booster 923 to start the APU 12.

As described above, in the conventional electric system 920L, 920R, the chargers 924, 925 are required to be provided to correspond to the secondary batteries 913, 922 which are the DC power supplies, respectively. In addition, to start the APU 12, the APU starting controller 921 and the booster 923 are required. In addition, to supply the backup electric power from the RAT generator 171 to the essential bus 22L, 22R, a path including the backup transformer/rectifier 926 and the DC power supply switch relay 285 is required. In a case where the DC power is not supplied from the TRU 251L, 251R, it is necessary to supply the backup electric power from the secondary battery 913. To this end, the battery power supply relay 287 is required. Because of this, the kinds of the components in the electric system (chargers, boosters, starting controllers, etc.) in the electric system increase, which may make the configuration of the electric system complicated, and may increase weight and cost.

The rated voltage of the secondary battery 913 is 24 VDC and is substantially equal to the rated voltage 28 VDC of the essential bus 22L, 22R. Therefore, to charge the secondary battery 913, the charger 924 for exclusive use is required. Since the secondary battery 913 is charged by using the charger 924 for exclusive use via the secondary AC bus 23L, it is required that the charging switch relay 286 intervene between the secondary battery 913 and the secondary battery charger 924 and the battery power supply switch relay 287 intervene between the secondary battery 913 and the essential bus 22L, 22R. For this reason, the secondary battery 913 cannot be always connected to the essential bus 22L, 22R.

In such a configuration, in a case where the electric power supply from the AC power generator 14L, 14R, stops in emergencies, in particular, in a case where the electric power is supplied from the secondary battery 913 by switching of the battery power supply switch relay 287, temporary power cut-off (instantaneous cut-off) occurs. When the power cut-off occurs, the electric device connected to the essential bus 22L, 22R stops temporarily. Therefore, to avoid the temporary stop, it is necessary to incorporate emergency power supplies such as batteries or capacitors into these electric devices.

In contrast, as shown in FIG. 1, the electric systems 20L, 20R of the present embodiment have the same configuration, and therefore, can reduce the kinds of components and simplify the electric system as compared to the conventional electric system.

Regarding the simplification of the configuration of the electric system, in the present embodiment, the chargers 924, 925 and the charging switch relay 286 become unnecessary, the APU starting controller 921 and the booster 923 become unnecessary. The path including the backup transformer/rectifier 926 and the DC power supply switch relay 285 becomes unnecessary in supply of the backup electric power from the RAT generator 171. The battery power supply switch relay 287 which is a cause of the instantaneous cut-off becomes unnecessary.

In the present embodiment, as described above, it is possible to avoid the instantaneous cut-off due to the switching of the electric power supply. Therefore, it is not necessary to provide the emergency power supplies in the electric devices connected to the essential buses 22L, 22R. Thus, a weight increase in the electric devices will not occur, and reliability can be improved.

Unlike the conventional configuration, in the present embodiment, the left electric system 20L includes the AC power stabilizing device 30L and the secondary battery 13L, and the right electric system 20R includes the AC power stabilizing device 30R and the secondary battery 13R. Therefore, a double system for starting the APU 12 using the DC power supplies is attained, and a double system for supplying the electric power from the secondary batteries 13L, 13R to the essential buses 22L, 22R is attained.

The secondary batteries 13L, 13R are connected to the APU 12 via the AC power stabilizing devices 30L, 30R, and the primary AC buses 21L, 21R, respectively, and have a high rated voltage sufficient to absorb a great power load. Therefore, it becomes possible to reduce wires for a current with a great magnitude from the secondary batteries 913, 922, which are used to flow the current with a great magnitude during starting of the APU 12. This results in a reduced weight of an aircraft.

Modified Example

Although in the present embodiment, the secondary batteries 13L, 13R having the rated voltage of 250V are illustrated as the DC power supplies, the present invention is not limited to this. For example, the DC power supplies may be capacitors having an equally rated voltage, or a combination of the capacitors and secondary batteries. As an example of the capacitors, electric double-layer capacitors having a high capacity, which are named ultra capacitors, may be used. Thus, in the present invention, the DC power supplies are not limited to the secondary batteries 13L, 13R so long as they can absorb the regenerative power from the electric devices such as the control surface actuator 15, and transiently supply necessary electric power.

A plurality of secondary batteries and/or capacitors may be combined to form DC power supplies provided that the weight of the aircraft is not increased excessively. In a case where the DC power supplies are the capacitors, stabilization of the electric system can be achieved but the APU 12 cannot be started. In view of this, to start the APU 12, a DC power supply for starting, or the like, may be provided separately.

Although the electric system stabilizing system for the aircraft of the present invention is suitably used especially in the aircraft in which most of the power systems are electrically driven, it may be suitably used in an aircraft in which at least a portion of the control surface actuator 15 is electrically driven or the entire control surface actuator 15 is electrically driven.

The great regenerative power or electric power demand shown in FIG. 9 tends to occur when great power loads are present in the electric system. Such power loads include the control surface actuator 15, another actuator, heaters, compressors, other motors, etc. Among these components, especially, great regenerative power from the control surface actuator 15 is more likely to occur. The control surface actuator 15 is used to operate the control surface of the aircraft and operates rapidly according to the motion of the aircraft. Since a great regenerative power from the control surface actuator 15 is more likely to occur during the motion of the aircraft, the electric system stabilizing system for the aircraft of the present invention is suitably employed in the aircraft in which at least the control surface actuator 15 is electrically driven.

Figure 12:
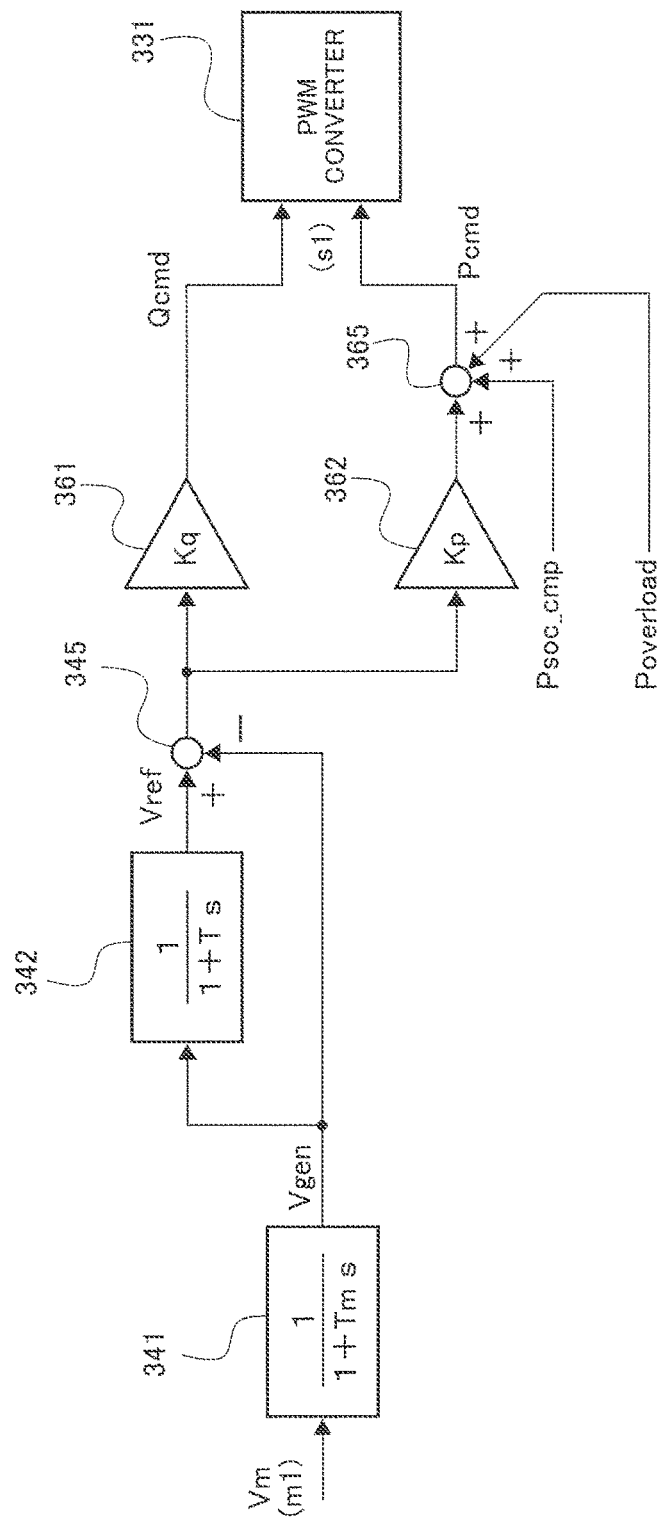
FIG. 12 is a block diagram showing another exemplary charging/discharging control circuit of FIG. 5A.
Figure 13:
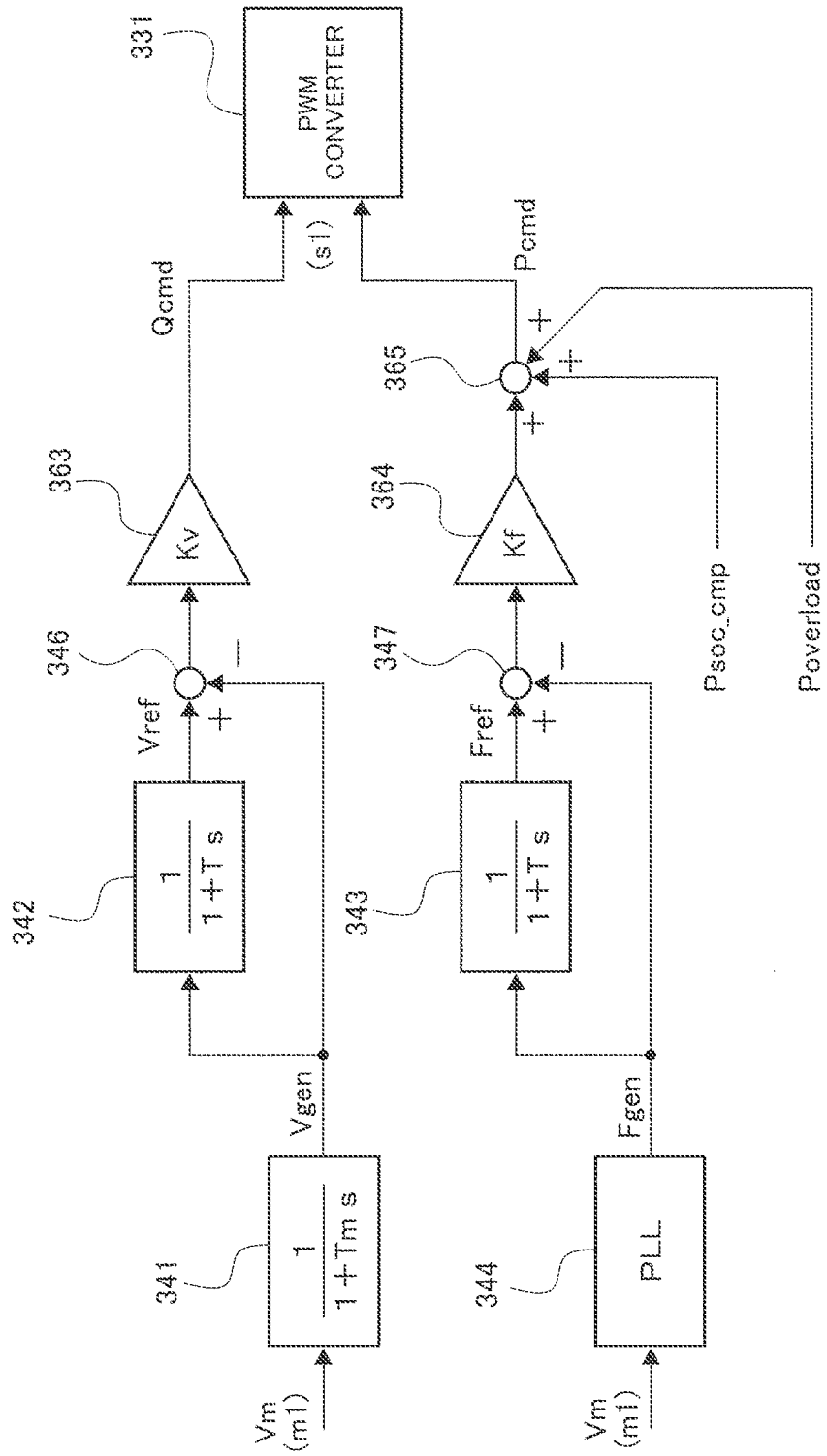
FIG. 13 is a block diagram showing another exemplary charging/discharging control circuit of FIG. 6.

In the electric system stabilizing system for aircraft of the present invention, as shown in FIGS. 12 and 13, the AC power stabilizing device 30L, 30R may be configured to supply a specified load from the secondary battery 13L, 13R to the primary AC bus 21L, 21R, when an overload occurs in the AC power supply (the AC power generator 14L, 14R, the APU starter/generator 124, or the RAT generator 171).

A description will be given of the AC power stabilizing device 30L, 30R capable of supplying a specified load from the secondary battery 13L, 13R, for example, in a case where the AC power supply is the VF generator (VF-adaptive type). In this case, as shown in FIG. 12, the power stabilizing control section 36 basically includes a charging/discharging control circuit similar in configuration to that of the charging/discharging control circuit of FIG. 5. The charging/discharging control circuit of FIG. 12 is different from the charging/discharging control circuit of FIG. 5 in that an overload compensation value Poverload is input to the adder 365. The overload compensation value Poverload is a compensation value used to relieve (or substantially cancel) an overload of the AC power supply by supplying specified auxiliary electric power (auxiliary load) from the secondary battery 13L, 13R to the primary AC bus 21L, 21R.

As in the case of the charging/discharging control circuit of FIG. 5A, the charging/discharging control circuit of FIG. 12 generates the active power compensation value Psoc_cmp and the power command signal Qcmd and outputs the active power compensation value Psoc_cmp and the power command signal Qcmd to the power converter section 33. As described above, a subtraction value (difference between a system voltage target value Vref and system voltage value Vgen) output from the subtractor 345 is output to the first comparator/controller 361 and to the second comparator/controller 362. The first comparator/controller 361 generates the power command signal Qcmd from the subtraction value and outputs the power command signal Qcmd to the power converter section 33, while the second comparator/controller 362 generates a multiplication value from the subtraction value, and outputs the multiplication value to the adder 365.

The multiplication value (base value of the power command signal Pcmd of the active power) from the second comparator/controller 362 and the active power compensation value Psoc_cmp from the SOC compensation circuit (see FIG. 5B), are input to the adder 365. In addition to these, the preset overload compensation value Poverload is input to the adder 365. The adder 365 adds the multiplication value, the active power compensation value Psoc_cmp, and the overload compensation value Poverload, to generate the power command signal Pcmd (=Kp×(Vref−Vgn)+Psoc_cmp+Poverload), and outputs the power command signal Pcmd to the power converter section 33. The power converter section 33 controls charging/discharging of the secondary battery 13L, 13R based on the power command signal Qcmd and the power command signal Pcmd.

The power stabilizing control section 36 causes the power converter section 33 to charge/discharge the active power into/from the secondary battery 13L, 13R in proportion to a value of a voltage increase or a value of a voltage decrease (drop) based on the power command signal Pcmd. At this time, the power command signal Pcmd includes the overload compensation value Poverload as described above. Therefore, the active power (specified load) corresponding to an overload can be supplied from the secondary battery 13L, 13R to the primary AC bus 21L, 21R, even when the overload occurs in the AC power generator 14L, 14R.

In the case where the AC power generator 14L, 14R is the CF generator (CF-adaptive type), as shown in FIG. 13, the power stabilizing control section 36 includes a charging/discharging control circuit which is basically similar to the charging/discharging control circuit of FIG. 6. The charging/discharging control circuit of FIG. 13 is different from the charging/discharging control circuit of FIG. 6 in that the overload compensation value Poverload is input to the adder 365. The charging/discharging control circuit of FIG. 13 generates the power command signal Qcmd and the power command signal Pcmd, outputs the power command signal Qcmd and the power command signal Pcmd to the power converter section 33, and the power converter section 33 controls charging/discharging (supplying a specified load) from the secondary battery 13L, 13R, as in the case of the VF generator, and therefore this will not be described in repetition. However, unlike the VF-adaptive type, the charging/discharging control circuit of FIG. 13 generates the power command signal Pcmd of the active power, using the subtraction value (difference between the system frequency target value Fref and the system frequency Fgen) of the frequency, as in the charging/discharging control circuit of FIG. 6.

As should be appreciated from the above, in the electric system stabilizing system for aircraft of the present invention, the power command signal Pcmd used for controlling charging/discharging of the active power may be generated using the overload compensation value Poverload. Thereby, the active power based on the overload compensation value Poverload can be supplied from the secondary battery 13L, 13R even when an overload occurs in the AC power generator 14L, 14R. This makes it possible to effectively suppress or avoid an influence of an overload on the electric systems 20L, 20R, and reduce an overload capacity of the AC power generator 14L, 14R.

The present invention is not limited to the above embodiments, but may be changed in various ways within a scope of the claims. Embodiments derived by suitably combining technical means disclosed in embodiments and plural modified examples are encompassed in a technical scope of the present invention.

Numeral modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

The present invention is suitably used in fields of stabilization of electric systems in commercial aircrafts, in particular, an aircraft in which at least a control surface actuator is electrically driven, and preferably, fields of MEAs in which other power systems are also electrically driven.

REFERENCE CHARACTERS LIST 11L left engine
11R right engine
12 auxiliary power unit (APU, power supply device)
13L, 13R secondary battery (power supply device, DC power supply)
14L, 14R AC power generator (power supply device, AC power supply)
15 control surface actuator
16 another power load
17 ram air turbine (RAT)
20L left electric system
20R right electric system
21L, 21R primary AC power supply bus (primary AC bus)
22L, 22R essential bus
23L, 23R secondary AC power supply bus (secondary AC bus)
24 DC power supply bus (DC bus)
30L, 30R AC power stabilizing device
33 power converter section
34 primary AC bus monitoring section
35 secondary battery monitoring section
36 power stabilizing control section
124 APU starter/generator
151 control surface actuator motor
161 hydraulic/air-conditioning motor
171 RAT generator
251L, 251R transformer/rectifier (TRU)
253L, 253R rectifier
261L, 261R transformer
262L, 262R voltage converter
331 PWM converter
332 boost converter
333, 334 motor controller

The invention claimed is:

1. An electric system stabilizing system for aircraft, comprising at least:
an electric system including a DC power supply and an AC power supply as an electric power supply device, and an AC power supply bus connected to the AC power supply, the electric system being configured to supply electric power to at least one electric device mounted in the aircraft; and
a power stabilizing device connected to the AC power supply bus and to the DC power supply, to stabilize an output of the electric power supply device;
wherein the DC power supply is configured to absorb regenerative power from the electric device and transiently supply electric power to the electric device;
wherein the power stabilizing device includes:
a power converter section including a PWM converter; and
a power stabilizing control section for controlling the power converter section;
wherein the power stabilizing control section monitors at least one of a change in a voltage and a change in a frequency in the AC power supply bus, and controls charging/discharging of the DC power supply according to a result of the monitoring, to stabilize the AC power supply bus; and
wherein, when regenerative power occurs in the electric device, the power stabilizing control section causes the electric power to be supplied from the AC power supply bus toward the DC power supply, and charges the DC power supply with the regenerative power to stabilize the AC power supply bus;
wherein the power stabilizing control section measures at least one of the voltage and the frequency in the AC power supply bus and determines that a first-order lag value of a measurement value of at least one of the voltage and the frequency is a target value in control; and
the power stabilizing control section controls charging/discharging of the DC power supply based on a difference between the target value and the measurement value.

2. The electric system stabilizing system for aircraft according to claim 1, wherein:
the aircraft includes an auxiliary power unit (APU) and a ram air turbine (RAT);
the electric system includes as the AC power supply:
an APU starter/generator mounted to the auxiliary power unit and configured to generate AC power, an AC power generator mounted to an engine, and a RAT generator mounted to the ram air turbine;
the electric system includes as the DC power supply, at least one of a secondary battery and a capacitor;

the DC power supply and the APU starter/generator are each connected to the power stabilizing device;

the AC power generator and the RAT generator are connected to the power stabilizing device via the AC power supply bus; and the APU starter/generator is connected to the power stabilizing device via the AC power supply bus.

3. The electric system stabilizing system for aircraft according to claim 2, wherein the electric system includes a power supply relay via which the power converter section is connected to the APU starter/generator or to the AC power generator;

wherein in a state in which the auxiliary power unit is deactivated and the power converter section is connected to the APU starter/generator by switching of the power supply relay, the power stabilizing control section causes the power converter section to convert DC power from the DC power supply into the AC power and supply the AC power to the APU starter/generator, to start the auxiliary power unit.

4. The electric system stabilizing system for aircraft according to claim 2, wherein the electric system includes a power supply relay via which the power converter section is connected to the APU starter/generator or to the AC power generator;

wherein in a state in which the DC power supply is in a chargeable state and the power converter section is connected to the AC power generator or the APU starter/generator by switching of the power supply relay, the power stabilizing control section causes the power converter section to convert the AC power from the AC power generator or the APU starter/generator into DC power and supply the DC power to the DC power supply, to charge the DC power supply.

5. The electric system stabilizing system for aircraft according to claim 2, wherein the at least one electric device is connected to the AC power supply bus; and wherein in a state in which the AC power is not supplied from the AC power generator to the electric device via the AC power supply bus, the power stabilizing control section causes the power converter section to convert DC power from the DC power supply into the AC power and supply the AC power to the electric device via the AC power supply bus for a specified time period.

6. The electric system stabilizing system for aircraft according to claim 2, wherein the electric system includes:

an essential bus supplied with the electric power from the AC power generator via the AC power supply bus and having a lower rated voltage than the DC power supply; and a voltage converter interposed between the essential bus and the DC power supply;

wherein the DC power supply is always connected to the essential bus via the power converter section; and wherein in a state in which the AC power is not supplied from the AC power generator to the essential bus, the electric power is supplied to the essential bus without cut-off.

7. The electric system stabilizing system for aircraft according to claim 6, wherein in a state in which the AC power generator is deactivated and the AC power is supplied from the RAT generator to the AC power supply bus, the power stabilizing control section causes the power converter section to convert the AC power from the RAT generator into DC power and supply the DC power to the essential bus.

8. The electric system stabilizing system for aircraft according to claim 6, wherein the aircraft includes one auxiliary power unit and at least one engine provided with the AC power generator, at each of right and left sides;

wherein the AC power supply bus includes an AC power supply bus provided at the left side and connected to the AC power generator provided at the left side, and an AC power supply bus provided at the right side and connected to the AC power generator provided at the right side;

wherein the electric system includes two electric systems which are:

a left electric system including the AC power generator provided at the left side, the AC power supply bus provided at the left side, the DC power supply, the power stabilizing device, and the essential bus; and a right electric system including the AC power generator provided at the right side, the AC power supply bus provided at the right side, the DC power supply, the power stabilizing device, and the essential bus; and the right and left AC power supply buses are connected to each other via a power supply relay, the right and left AC power supply buses are connected to the APU starter/generator via power supply relays; and the right and left essential buses are connected to each other via a power supply relay.

9. The electric system stabilizing system for aircraft according to claim 1, wherein in the aircraft, at least either a hydraulic system or a breed air system is electrically driven;

the electric system includes a DC power supply bus connected to a controller of the electric device; and a controller of the hydraulic system or breed air system which is electrically driven, is connected to the DC power supply bus.

10. The electric system stabilizing system for aircraft according to claim 1, wherein the power stabilizing control section monitors a state of charge (SOC) of the DC power supply and makes compensation for a charging/discharging amount of the DC power supply based on a difference between a measurement value of the SOC and a preset target value of a charging rate.

11. The electric system stabilizing system for aircraft according to claim 1, wherein the power stabilizing control section multiplies a difference between the target value and the measurement value by a proportional constant preset for active power or reactive power, to generate a power command signal of the active power or a power command signal of the reactive power;

the power stabilizing control section generates an active power compensation value from a difference between a measurement value of SOC of the DC power supply and a preset target value of the SOC;

the power stabilizing control section adds the active power compensation value to a base value which is the generated power command signal of the active power to generate a final value of the power command signal of the active power; and the power stabilizing control section controls charging/discharging of the DC power supply based on the power command signal of the reactive power and the final value of the power command signal of the active power.

12. The electric system stabilizing system for aircraft according to claim 11, wherein the power stabilizing control section adds to the base value of the power command signal of the active power, the active power compensation value and an overload compensation value preset to supply auxiliary electric power from the DC power supply to the AC power supply bus, to generate the final value of the power command signal of the active power.

13. The electric system stabilizing system for aircraft according to claim 1, wherein when AC power generated in the AC power supply has a variable frequency, the power stabilizing control section causes the power converter section to charge the DC power supply with active power in proportion to an increase in the voltage, to output reactive power with a leading power factor in proportion to the increase in the voltage, or to charge the DC power supply with the active power in proportion to the increase in the voltage and output the reactive power with the leading power factor in proportion to the increase in the voltage, if the increase in the voltage is monitored; and wherein when the AC power generated in the AC power supply has a variable frequency, the power stabilizing control section causes the power converter section to discharge the active power from the DC power supply in proportion to a decrease in the voltage, to output the reactive power with a lagging power factor in proportion to the decrease in the voltage, or to discharge the active power from the DC power supply in proportion to the decrease in the voltage and output the reactive power with the lagging power factor in proportion to the decrease in the voltage, if the decrease in the voltage is monitored.

14. The electric system stabilizing system for aircraft according to claim 1, wherein when AC power generated in the AC power supply has a constant frequency;

the power stabilizing control section causes the power converter section to charge the DC power supply with active power, in proportion to an increase in the frequency if the increase in the frequency is monitored; and wherein when the AC power generated in the AC power supply has a constant frequency, the power stabilizing control section causes the power converter section to discharge the active power from the DC power supply in proportion to a decrease in the frequency if the decrease in the frequency is monitored.

15. The electric system stabilizing system for aircraft according to claim 1, wherein when AC power generated in the AC power supply has a constant frequency, the power stabilizing control section causes the power converter section to output reactive power of a leading power factor in proportion to an increase in the voltage if the increase in the voltage is monitored; and wherein when the AC power generated in the AC power supply has a constant frequency, the power stabilizing control section causes the power converter section to output reactive power of a lagging power factor in proportion to a decrease in the voltage if the decrease in the voltage is monitored.

16. The electric system stabilizing system for aircraft according to claim 1, wherein the electric device is an actuator for controlling a control surface.

17. A method of stabilizing an electric system for aircraft, the electric system including a DC power supply and an AC power supply as an electric power supply device, and an AC power supply bus connected to the AC power supply, the electric system being configured to supply electric power to at least one electric device mounted in the aircraft; the method comprising:

using as the DC power supply, a DC power supply configured to absorb regenerative power from the electric device and transiently supply electric power to the electric device;

monitoring at least one of a change in a voltage and a change in a frequency in the AC power supply bus and controlling charging/discharging of the DC power supply based on a result of the monitoring, thereby stabilizing the AC power supply bus; and when regenerative power occurs in the electric device, causing the electric power to be supplied from the AC power supply bus toward the DC power supply, and charging the DC power supply with the regenerative power to stabilize the AC power supply bus, wherein at least one of the voltage and the frequency in the AC power supply bus is measured and it is determined that a first-order lag value of a measurement value of at least one of the voltage and the frequency is a target value in control; and wherein the charging/discharging of the DC power supply is controlled based on a difference between the target value and the measurement value.

* * * * *